(12) United States Patent
Tiwari

(10) Patent No.: US 12,242,848 B2
(45) Date of Patent: *Mar. 4, 2025

(54) VECTOR POPULATION COUNT DETERMINATION VIA COMPARISON ITERATIONS IN MEMORY

(71) Applicant: Lodestar Licensing Group LLC, Evanston, IL (US)

(72) Inventor: Sanjay Tiwari, Meridian, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 18/202,161

(22) Filed: May 25, 2023

(65) Prior Publication Data

US 2023/0418606 A1 Dec. 28, 2023

Related U.S. Application Data

(63) Continuation of application No. 17/151,039, filed on Jan. 15, 2021, now Pat. No. 11,663,005, which is a continuation of application No. 16/207,786, filed on Dec. 3, 2018, now Pat. No. 10,896,042, which is a
(Continued)

(51) Int. Cl.
*G06F 9/30* (2018.01)
*G06F 7/60* (2006.01)
*G06F 15/78* (2006.01)

(52) U.S. Cl.
CPC ............ *G06F 9/3004* (2013.01); *G06F 7/607* (2013.01); *G06F 9/30021* (2013.01); *G06F 9/30036* (2013.01); *G06F 9/30038* (2023.08); *G06F 15/7821* (2013.01); *G06F 15/7839* (2013.01)

(58) Field of Classification Search
CPC ............ G06F 15/7821; G06F 9/30018; G06F 9/30036; G06F 7/607; G06F 7/74; G06F 9/3004; G06F 15/7839; G06F 9/30021; G11C 11/4096; G11C 7/1009; G11C 7/1012; G11C 7/1006; G11C 11/4091; G11C 2207/104; G11C 2207/005; G11C 2207/002
See application file for complete search history.

(56) References Cited

U.S. PATENT DOCUMENTS

| | | |
|---|---|---|
| 3,711,692 A | 1/1973 | Batcher |
| 4,189,716 A | 2/1980 | Krambeck |
| 4,380,046 A | 4/1983 | Fung |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing. (Provided in U.S. Appl. No. 15/065,483).

(Continued)

*Primary Examiner* — Shawn Doman

(57) ABSTRACT

Examples of the present disclosure provide apparatuses and methods for determining a vector population count in a memory. An example method comprises determining, using sensing circuitry, a vector population count of a number of fixed length elements of a vector stored in a memory array.

18 Claims, 14 Drawing Sheets

Related U.S. Application Data continuation of application No. 15/065,483, filed on Mar. 9, 2016, now Pat. No. 10,146,537.

(60) Provisional application No. 62/132,891, filed on Mar. 13, 2015.

(56) References Cited

U.S. PATENT DOCUMENTS

| | | |
|---|---|---|
| 4,435,792 A | 3/1984 | Bechtolsheim |
| 4,435,793 A | 3/1984 | Ochii |
| 4,486,848 A | 12/1984 | Kaminski |
| 4,498,177 A | 2/1985 | Larson |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 4,989,168 A | 1/1991 | Kuroda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,339,447 A | 8/1994 | Balmer |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,430,687 A | 7/1995 | Hung et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,541,865 A | 7/1996 | Ashkenazi |
| 5,570,306 A | 10/1996 | Soo |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,717,616 A | 2/1998 | Morris |
| 5,724,291 A | 3/1998 | Matano |
| 5,724,366 A | 3/1998 | Furutani |
| 5,734,599 A | 3/1998 | Lee et al. |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,158,042 A | 12/2000 | Shagam |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,430,251 B1 | 8/2002 | Gold |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,664,967 B1 | 12/2003 | Cook |
| 6,731,542 B1 | 5/2004 | Le et al. |
| 6,754,746 B1 | 6/2004 | Leung et al. |
| 6,760,837 B1 | 7/2004 | Laurenti et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 | 6/2006 | Ding et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,532,529 B2 | 5/2009 | Dadashev et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |

(56) References Cited

U.S. PATENT DOCUMENTS

| | | |
|---|---|---|
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,098,332 B1 * | 8/2015 | Langhammer ...... G06F 7/49957 |
| 9,165,023 B2 | 10/2015 | Moskovich et al. |
| 9,189,200 B1 * | 11/2015 | Langhammer .......... G06F 7/483 |
| 9,235,414 B2 | 1/2016 | Gopal et al. |
| 9,513,907 B2 | 12/2016 | Ould-Ahmend-Vall et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2002/0073127 A1 | 6/2002 | Hossain |
| 2002/0083106 A1 | 6/2002 | Becker |
| 2002/0095450 A1 | 7/2002 | Karim et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0223580 A1 | 11/2004 | Shackleford et al. |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2008/0282136 A1 | 11/2008 | Yamashita |
| 2009/0016480 A1 | 1/2009 | Moyer et al. |
| 2009/0019100 A1 | 1/2009 | Moyer et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0049779 A1 | 2/2010 | Blaner et al. |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Zou et al. |
| 2011/0219260 A1 | 9/2011 | Nobunaga et al. |
| 2011/0238717 A1 | 9/2011 | Bell |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0257483 A1 | 10/2013 | Bulzacchelli |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0189307 A1 | 7/2014 | Valentine et al. |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0089166 A1 | 3/2015 | Kogge |
| 2015/0134713 A1 | 5/2015 | Wheeler |
| 2015/0199150 A1 | 7/2015 | Jeon et al. |
| 2015/0324290 A1 | 11/2015 | Leidel |

(56) References Cited

U.S. PATENT DOCUMENTS

2015/0325272 A1    11/2015   Murphy
2016/0098200 A1    4/2016   Guz et al.

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305. (Provided in U.S. Appl. No. 15/065,483).

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html (Provided in U.S. Appl. No. 15/065,483).

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing. (Provided in U.S. Appl. No. 15/065,483).

Debnath, Biplob, Bloomflash: Bloom Filter on Flash-Based Storage, 2011 31st Annual Conference on Distributed Computing Systems, Jun. 20-24, 2011, 10 pgs. (Provided in U.S. Appl. No. 15/065,483).

Pagiamtzis, Kostas, "Content-Addressable Memory Introduction", Jun. 25, 2007, (6 pgs.), retrieved from: http://www.pagiamtzis.com/cam/camintro (Provided in U.S. Appl. No. 15/065,483).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits. (Provided in U.S. Appl. No. 15/065,483).

International Search Report and Written Opinion for PCT Application No. PCT/US2013/043702, mailed Sep. 26, 2013, (11 pgs.). (Provided in U.S. Appl. No. 15/065,483).

Elliot, et al., "Computational RAM: Implementing Processors in Memory", Jan.-Mar. 1999, (10 pgs.), vol. 16, Issue 1, IEEE Design and Test of Computers Magazine. (Provided in U.S. Appl. No. 15/065,483).

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures. (Provided in U.S. Appl. No. 15/065,483).

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf. (Provided in U.S. Appl. No. 15/065,483).

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf. (Provided in U.S. Appl. No. 15/065,483).

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf. (Provided in U.S. Appl. No. 15/065,483).

U.S. Appl. No. 15/065,483, entitled, "Methods and Apparatus for Pattern Matching," filed Apr. 17, 2012, (37 pgs.). (Provided in U.S. Appl. No. 15/065,483).

U.S. Appl. No. 15/065,483, entitled, "Weighted Search and Compare in a Memory Device," filed Jan. 17, 2013, (25 pgs.). (Provided in U.S. Appl. No. 15/065,483).

U.S. Appl. No. 15/065,483, entitled, "Memory as a Programmable Logic Device," filed Feb. 22, 2013, (30 pgs.). (Provided in U.S. Appl. No. 15/065,483).

U.S. Appl. No. 15/065,483, entitled, "Neural Network in a Memory Device," filed Feb. 22, 2013, (63 pgs.). (Provided in U.S. Appl. No. 15/065,483).

U.S. Appl. No. 13/796,189, entitled, "Performing Complex Arithmetic Functions in a Memory Device," filed Mar. 12, 2013, (23 pgs.). (Provided in U.S. Appl. No. 15/065,483).

Warren Jr., Henry S., "Hacker's Delight", Second Edition, Oct. 2013, pp. 181-184 and 194. (Provided in U.S. Appl. No. 15/065,483).

* cited by examiner

| | COMP_COMP ⌐431 | TEMP_LOOKUP ⌐433 | REDUCTION ⌐435 | ELEM_MASK ⌐437 | DESTINATION ⌐439 |
|---|---|---|---|---|---|
| 451-1 | 0X0 | 0X0 | 0X0 | 0X0 | 0X0 |
| 451-3.a | 0XFF,FF,FF,FF | 0X0 | 0X0 | 0X0 | 0X0 |
| 451-3.b | 0X7F,FF,FF,FF | 0X0 | 0X0 | 0X0 | 0X0 |
| 451-3.c | 0X80,00,00,00 | 0X0 | 0X80,00,00,00 | 0X0 | 0X0 |
| 451-3.d | 0X00,80,00,00 | 0X0 | 0X80,00,00,00 | 0X0 | 0X0 |
| 451-3.e | 0X80,80,00,00 | 0X0 | 0X80,00,00,00 | 0X0 | 0X0 |
| 451-3.f | 0X00,80,80,00 | 0X0 | 0X80,00,00,00 | 0X0 | 0X0 |
| 451-3.g | 0X80,80,80,00 | 0X0 | 0X80,00,00,00 | 0X0 | 0X0 |
| 451-3.h | 0X00,80,80,80 | 0X0 | 0X80,00,00,00 | 0X0 | 0X0 |
| 451-3.i | 0X80,80,80,80 | 0X0 | 0X80,00,00,00 | 0X0 | 0X0 |
| 451-3.j | 0X80,80,80,80 | 0X0 | 0X80,80,80,80 | 0X80,80,80,80 | 0X0 |
| 451-4 | 0X80,80,80,80 | 0X0 | 0X80,80,80,80 | 0X80,80,80,80 | 0X75,07,50,55 |

*Fig. 4A*

|  | COMP_COMP (431) | TEMP_LOOKUP (433) | REDUCTION (435) | ELEMENT_MASK (437) | DESTINATION (439) |
|---|---|---|---|---|---|
| 451-5.a.1 | 0X80,80,80,80 | 0X0 | 0X80,80,80,80 | 0X80,80,80,80 | 0X75,07,50,55 |
| 451-5.a.2 | 0X80,80,80,80 | 0X0 | 0X80,80,80,80 | 0X80,80,80,80 | 0X75,07,50,55 |
| 451-5.a.3 | 0X80,80,80,80 | 0X80,80,80,80 | 0X80,80,80,80 | 0X80,80,80,80 | 0X75,07,50,55 |
| 451-5.a.4 | 0X20,20,20,20 | 0X80,80,80,80 | 0X80,80,80,80 | 0X80,80,80,80 | 0X75,07,50,55 |
| 451-5.a.5 | 0XA0,A0,A0,A0 | 0X80,80,80,80 | 0X80,80,80,80 | 0X80,80,80,80 | 0X75,07,50,55 |
| 451-5.a.6 | 0XA0,A0,A0,A0 | 0XA0,A0,A0,A0 | 0X80,80,80,80 | 0X80,80,80,80 | 0X75,07,50,55 |
| 451-5.a.7 | 0X28,28,28,28 | 0XA0,A0,A0,A0 | 0X80,80,80,80 | 0X80,80,80,80 | 0X75,07,50,55 |
| 451-5.a.8 | 0XA8,A8,A8,A8 | 0XA0,A0,A0,A0 | 0X80,80,80,80 | 0X80,80,80,80 | 0X75,07,50,55 |
| 451-5.a.9 | 0XA8,A8,A8,A8 | 0XA8,A8,A8,A8 | 0X80,80,80,80 | 0X80,80,80,80 | 0X75,07,50,55 |
| 451-5.a.10 | 0X2A,2A,2A,2A | 0XA8,A8,A8,A9 | 0X80,80,80,80 | 0X80,80,80,80 | 0X75,07,50,55 |
| 451-5.a.11 | 0XAA,AA,AA,AA | 0XA8,A8,A8,A10 | 0X80,80,80,80 | 0X80,80,80,80 | 0X75,07,50,55 |
| 451-5.a.12 | 0XAA,AA,AA,AA | 0XAA,AA,AA,AA | 0X80,80,80,80 | 0X80,80,80,80 | 0X75,07,50,55 |
| 451-5.a.13 | 0XAA,AA,AA,AA | 0XAA,AA,AA,AA | 0XAA,AA,AA,AA | 0X80,80,80,80 | 0X75,07,50,55 |
| 451-5.b.1 | 0X20,02,00,00 | 0XAA,AA,AA,AA | 0XAA,AA,AA,AA | 0X80,80,80,80 | 0X75,07,50,55 |
| 451-5.b.2 | 0X10,01,00,00 | 0XAA,AA,AA,AA | 0XAA,AA,AA,AA | 0X80,80,80,80 | 0X75,07,50,55 |
| 451-5.b.3 | 0X10,01,00,00 | 0X10,01,00,00 | 0XAA,AA,AA,AA | 0X80,80,80,80 | 0X75,07,50,55 |
| 451-5.c.1 | 0X55,55,55,55 | 0X10,01,00,00 | 0XAA,AA,AA,AA | 0X80,80,80,80 | 0X75,07,50,55 |
| 451-5.c.2 | 0X55,05,50,55 | 0X10,01,00,00 | 0XAA,AA,AA,AA | 0X80,80,80,80 | 0X75,07,50,55 |
| 451-5.c.3 | 0X55,05,50,55 | 0X10,01,00,00 | 0XAA,AA,AA,AA | 0X80,80,80,80 | 0X55,05,50,55 |
| 451-5.d.1 | 0X10,01,00,00 | 0X10,01,00,00 | 0XAA,AA,AA,AA | 0X80,80,80,80 | 0X45,04,50,55 |
| 451-5.d.2 | 0X20,02,00,00 | 0X10,01,00,00 | 0XAA,AA,AA,AA | 0X80,80,80,80 | 0X45,04,50,55 |
| 451-5.d.3 | 0X20,02,00,00 | 0X10,01,00,00 | 0XAA,AA,AA,AA | 0X80,80,80,80 | 0X45,04,50,55 |
| 451-5.d.4 | 0X0 | 0X10,01,00,00 | 0XAA,AA,AA,AA | 0X80,80,80,80 | 0X65,06,50,55 |
| 451-5.d.5 | 0X0 | 0X10,01,00,00 | 0XAA,AA,AA,AA | 0X80,80,80,80 | 0X65,06,50,55 |
| 451-5.d.6 | 0X0 | 0X10,01,00,00 | 0XAA,AA,AA,AA | 0X80,80,80,80 | 0X65,06,50,55 |

*Fig. 4B*

|  | COMP_COMP (431) | TEMP_LOOKUP (433) | REDUCTION (435) | ELEMENT_MASK (437) | DESTINATION (439) |
|---|---|---|---|---|---|
| 451-6.a.1 | 0X0 | 0X10,01,00,00 | 0X80,80,80,80 | 0X80,80,80,80 | 0X65,06,50,55 |
| 451-6.a.2 | 0X80,80,80,80 | 0X10,01,00,00 | 0X80,80,80,80 | 0X80,80,80,80 | 0X65,06,50,55 |
| 451-6.a.3 | 0X40,40,40,40 | 0X10,01,00,00 | 0X80,80,80,80 | 0X80,80,80,80 | 0X65,06,50,55 |
| 451-6.a.4 | 0XC0,C0,C0,C0 | 0X10,01,00,00 | 0X80,80,80,80 | 0X80,80,80,80 | 0X65,06,50,55 |
| 451-6.a.5 | 0XC0,C0,C0,C0 | 0XC0,C0,C0,C0 | 0X80,80,80,80 | 0X80,80,80,80 | 0X65,06,50,55 |
| 451-6.a.6 | 0X0C,0C,0C,0C | 0XC0,C0,C0,C0 | 0X80,80,80,80 | 0X80,80,80,80 | 0X65,06,50,55 |
| 451-6.a.7 | 0XCC,CC,CC,CC | 0XC0,C0,C0,C0 | 0X80,80,80,80 | 0X80,80,80,80 | 0X65,06,50,55 |
| 451-6.a.8 | 0XCC,CC,CC,CC | 0XCC,CC,CC,CC | 0X80,80,80,80 | 0X80,80,80,80 | 0X65,06,50,55 |
| 451-6.a.9 | 0XCC,CC,CC,CC | 0XCC,CC,CC,CC | 0XCC,CC,CC,CC | 0X80,80,80,80 | 0X65,06,50,55 |
| 451-6.b.1 | 0X44,04,40,44 | 0XCC,CC,CC,CC | 0XCC,CC,CC,CC | 0X80,80,80,80 | 0X65,06,50,55 |
| 451-6.b.2 | 0X11,01,10,11 | 0XCC,CC,CC,CC | 0XCC,CC,CC,CC | 0X80,80,80,80 | 0X65,06,50,55 |
| 451-6.b.3 | 0X11,01,10,11 | 0X11,01,10,11 | 0XCC,CC,CC,CC | 0X80,80,80,80 | 0X65,06,50,55 |
| 451-6.c.1 | 0X33,33,33,33 | 0X11,01,10,11 | 0XCC,CC,CC,CC | 0X80,80,80,80 | 0X65,06,50,55 |
| 451-6.c.2 | 0X21,02,10,11 | 0X11,01,10,11 | 0XCC,CC,CC,CC | 0X80,80,80,80 | 0X65,06,50,55 |
| 451-6.c.3 | 0X21,02,10,11 | 0X11,01,10,11 | 0XCC,CC,CC,CC | 0X80,80,80,80 | 0X21,02,10,11 |
| 451-6.d.1 | 0X01,00,10,11 | 0X11,01,10,11 | 0XCC,CC,CC,CC | 0X80,80,80,80 | 0X30,03,00,00 |
| 451-6.d.2 | 0X02,00,20,22 | 0X11,01,10,11 | 0XCC,CC,CC,CC | 0X80,80,80,80 | 0X30,03,00,00 |
| 451-6.d.3 | 0X02,00,20,22 | 0X11,01,10,11 | 0XCC,CC,CC,CC | 0X80,80,80,80 | 0X30,03,00,00 |
| 451-6.d.4 | 0X0 | 0X11,01,10,11 | 0XCC,CC,CC,CC | 0X80,80,80,80 | 0X32,03,20,22 |
| 451-6.d.5 | 0X0 | 0X11,01,10,11 | 0XCC,CC,CC,CC | 0X80,80,80,80 | 0X32,03,20,22 |
| 451-6.d.6 | 0X0 | 0X11,01,10,11 | 0XCC,CC,CC,CC | 0X80,80,80,80 | 0X32,03,20,22 |

*Fig. 4C*

|  | COMP_COMP (431) | TEMP_LOOKUP (433) | REDUCTION (435) | ELEMENT_MASK (437) | DESTINATION (439) |
|---|---|---|---|---|---|
| 451-7.a.1 | 0X0 | 0X11,01,10,11 | 0X80,80,80,80 | 0X80,80,80,80 | 0X32,03,20,22 |
| 451-7.a.2 | 0X80,80,80,80 | 0X11,01,10,11 | 0X80,80,80,80 | 0X80,80,80,80 | 0X32,03,20,22 |
| 451-7.a.3 | 0X40,40,40,40 | 0X11,01,10,11 | 0X80,80,80,80 | 0X80,80,80,80 | 0X32,03,20,22 |
| 451-7.a.4 | 0XC0,C0,C0,C0 | 0X11,01,10,11 | 0X80,80,80,80 | 0X80,80,80,80 | 0X32,03,20,22 |
| 451-7.a.5 | 0X60,60,60,60 | 0X11,01,10,11 | 0X80,80,80,80 | 0X80,80,80,80 | 0X32,03,20,22 |
| 451-7.a.6 | 0XE0,E0,E0,E0 | 0X11,01,10,11 | 0X80,80,80,80 | 0X80,80,80,80 | 0X32,03,20,22 |
| 451-7.a.7 | 0X70,70,70,70 | 0X11,01,10,11 | 0X80,80,80,80 | 0X80,80,80,80 | 0X32,03,20,22 |
| 451-7.a.8 | 0XF0,F0,F0,F0 | 0X11,01,10,11 | 0X80,80,80,80 | 0X80,80,80,80 | 0X32,03,20,22 |
| 451-7.a.9 | 0XF0,F0,F0,F0 | 0XF0,F0,F0,F0 | 0X80,80,80,80 | 0X80,80,80,80 | 0X32,03,20,22 |
| 451-7.a.10 | 0XF0,F0,F0,F0 | 0XF0,F0,F0,F0 | 0XF0,F0,F0,F0 | 0X80,80,80,80 | 0X32,03,20,22 |
| 451-7.b.1 | 0X30,00,20,20 | 0XF0,F0,F0,F0 | 0XF0,F0,F0,F0 | 0X80,80,80,80 | 0X32,03,20,22 |
| 451-7.b.2 | 0X03,00,02,02 | 0XF0,F0,F0,F0 | 0XF0,F0,F0,F0 | 0X80,80,80,80 | 0X32,03,20,22 |
| 451-7.b.3 | 0X03,00,02,02 | 0X03,00,02,02 | 0XF0,F0,F0,F0 | 0X80,80,80,80 | 0X32,03,20,22 |
| 451-7.c.1 | 0X0F,0F,0F,0F | 0X03,00,02,02 | 0XF0,F0,F0,F0 | 0X80,80,80,80 | 0X32,03,20,22 |
| 451-7.c.2 | 0X02,03,00,02 | 0X03,00,02,02 | 0XF0,F0,F0,F0 | 0X80,80,80,80 | 0X32,03,20,22 |
| 451-7.c.3 | 0X02,03,00,02 | 0X03,00,02,02 | 0XF0,F0,F0,F0 | 0X80,80,80,80 | 0X02,03,00,02 |
| 451-7.d.1 | 0X02,00,00,02 | 0X03,00,02,02 | 0XF0,F0,F0,F0 | 0X80,80,80,80 | 0X01,03,02,00 |
| 451-7.d.2 | 0X04,00,00,04 | 0X03,00,02,02 | 0XF0,F0,F0,F0 | 0X80,80,80,80 | 0X01,03,02,00 |
| 451-7.d.3 | 0X04,00,00,04 | 0X03,00,02,02 | 0XF0,F0,F0,F0 | 0X80,80,80,80 | 0X01,03,02,00 |
| 451-7.d.4 | 0X0 | 0X03,00,02,02 | 0XF0,F0,F0,F0 | 0X80,80,80,80 | 0X05,03,02,04 |
| 451-7.d.5 | 0X0 | 0X03,00,02,02 | 0XF0,F0,F0,F0 | 0X80,80,80,80 | 0X05,03,02,04 |
| 451-7.d.6 | 0X0 | 0X03,00,02,02 | 0XF0,F0,F0,F0 | 0X80,80,80,80 | 0X05,03,02,04 |

*Fig. 4D*

VECTOR POPULATION COUNT DETERMINATION VIA COMPARISON ITERATIONS IN MEMORY

PRIORITY INFORMATION

This application is a Continuation of U.S. application Ser. No. 17/151,039 filed Jan. 15, 2021 which issues as U.S. Pat. No. 11,663,005 on May 30, 2023, which is a Continuation of U.S. application Ser. No. 16/207,786, filed Dec. 3, 2018, which issues as U.S. Pat. No. 10,896,042 on Jan. 19, 2021, which is a Continuation of U.S. application Ser. No. 15/065,483, filed Mar. 9, 2016, which issued as U.S. Pat. No. 10,146,537 on Dec. 4, 2018, which claims the benefit of U.S. Provisional Application No. 62/132,891, filed Mar. 13, 2015, the contents of which are included herein by reference.

TECHNICAL FIELD

The present disclosure relates generally to semiconductor memory apparatuses and methods, and more particularly, to apparatuses and methods related to vector population count determination in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered.

In many instances, the processing resources (e.g., processor and/or associated functional unit circuitry) may be external to the memory array, and data can be accessed (e.g., via a bus between the processing resources and the memory array to execute instructions). Data can be moved from the memory array to registers external to the memory array via a bus.

BRIEF DESCRIPTION OF THE DRAWINGS

FIGS. 4A-4D illustrate tables showing the states of memory cells of an array at a particular phase associated with vector population counting in accordance with a number of embodiments of the present disclosure.

DETAILED DESCRIPTION

Figure 1:
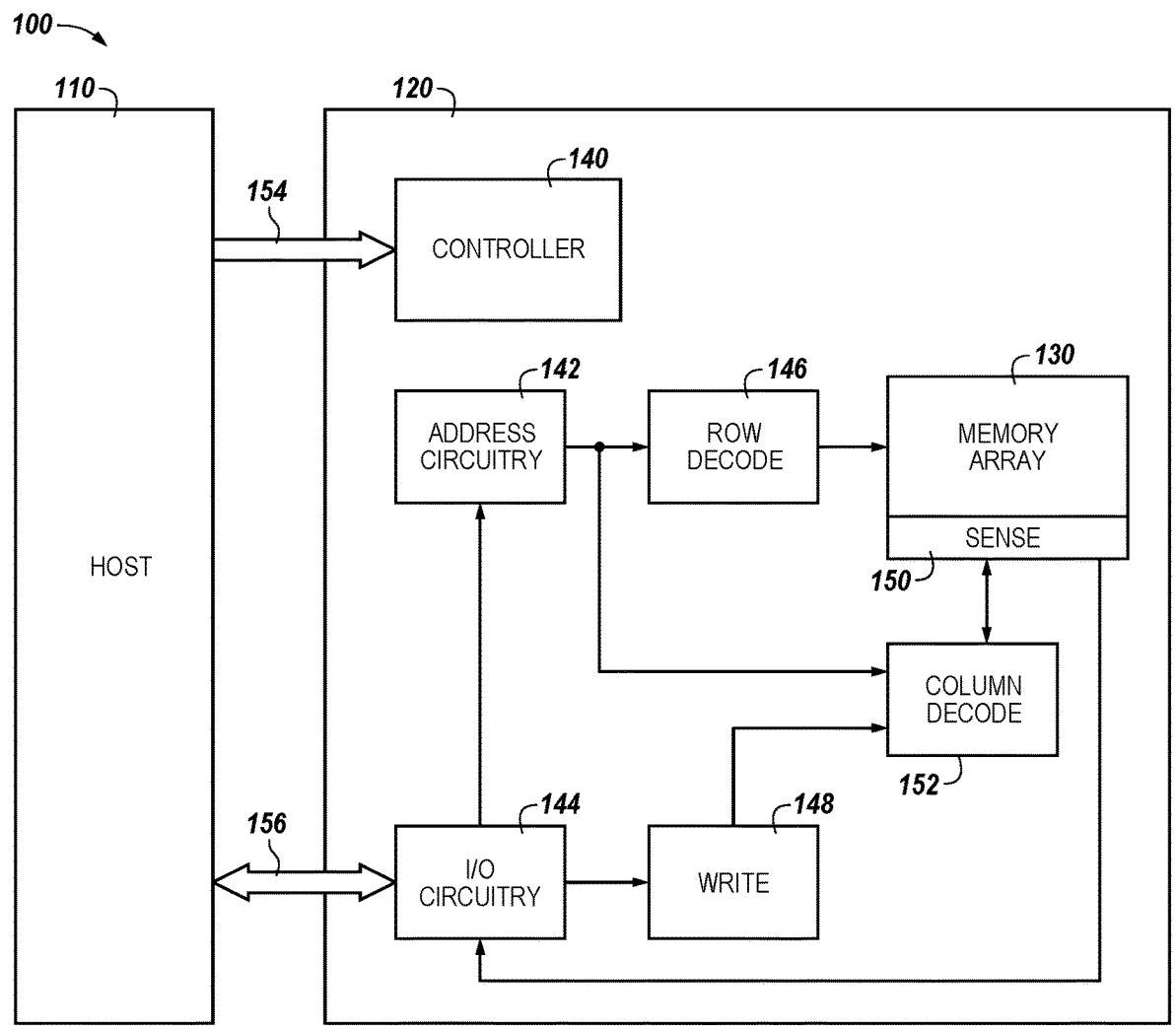
FIG. 1 is a block diagram of an apparatus in the form of a computing system including a memory device in accordance with a number of embodiments of the present disclosure.

The present disclosure includes apparatuses and methods related to vector population counting in memory. An example method comprises determining, using sensing circuitry, a vector population count of a number of fixed length elements of a vector stored in a memory array. A determination of a population count of a vector element can be performed in memory. For example, a determination of a vector population count can include determining a number of bits that are programmed to logical state 1, for example. Also, a determination of a vector population count can include determining a number of bits that are programmed to logical state 0, for example. For example, a determination of how many bits in a vector are programmed to a particular logical state. The determination of a vector population count can include performing a number of AND operations, shift operations, and invert operations without transferring data via an input/output (I/O) line, for example.

In a number of examples, an element can represent an object and/or other construct, which may be stored in memory as a bit-vector. As an example, a number of bits can be stored in memory cells coupled to a particular access line (e.g., a row) of a memory array as a vector. The vector can comprise a number of elements which may have fixed lengths (e.g., each element is the same length). For example, the elements are $2^n$ bits in length, where n is a positive integer.

A number of embodiments of the present disclosure can provide a reduction of the number of computations and/or time involved in performing a determination of the vector population count for a plurality of fixed length elements relative to previous approaches. For instance, the number of computations and/or the time to perform a determination of a vector population count can be reduced by performing operations in memory in parallel (e.g., simultaneously). Performing a determination of a vector population count as described herein can also reduce power consumption as compared to previous approaches. In accordance with a number of embodiments, a determination of a vector population count can be performed on elements (e.g., data in the form of bit-vectors including elements of fixed length stored in an array) without transferring data out of the memory array and/or sensing circuitry via a bus (e.g., data bus, address bus, control bus, etc.). A determination of a vector population count can involve performing a number of operations (e.g., AND operations, OR operations, shift operations, invert operations, and BlockOR operations, etc.). However, embodiments are not limited to these examples.

In various previous approaches, fixed length elements may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, often only a single function can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU), which can involve performing a sense line address access (e.g., firing of a column decode signal) in order to transfer data from sense lines onto I/O lines, moving the data to the array periphery, and providing the data to a register in association with determining a vector population count, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "S," "T," "U," "V," "W," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 231 may reference element "31" in FIG. 2, and a similar element may be referenced as 331 in FIG. 3. As will be appreciated, elements shown in the various embodiments herein can be added, exchanged, and/ or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense FIG. 1 is a block diagram of an apparatus in the form of a computing system 100 including a memory device 120 in accordance with a number of embodiments of the present disclosure. As used herein, a memory device 120, a memory array 130, controller 140, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIGS. 2 and 3.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The controller 140 can be a state machine, a sequencer, or some other type of controller.

An example of the sensing circuitry 150 is described further below in association with FIGS. 2A and 2B. For instance, in a number of embodiments, the sensing circuitry 150 can comprise a number of sense amplifiers and a number of compute components, which may comprise a latch serving as a Comp_Computator and can be used to perform logical operations (e.g., on data associated with complementary sense lines). In a number of embodiments, the sensing circuitry (e.g., 150) can be used to determine a vector population count using data stored in array 130 as inputs and store the results of the vector population count determination back to the array 130 without transferring via a sense line address access (e.g., without firing a column decode signal). As such, a determination of a vector population count can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on controller 140 or elsewhere)).

In various previous approaches, data associated with a determination of a length of an element, for instance, would be read from memory via sensing circuitry and provided to an external ALU (e.g., via a bus). The external ALU circuitry would be used to perform the vector population count determination using the elements (which may be referred to as operands or inputs) and the result could be transferred back to the array via the local I/O lines. In contrast, in a number of embodiments of the present disclosure, sensing circuitry (e.g., 150) is configured to perform a determination of a vector population count on data stored in memory cells in memory array 130 and store the result back to the array 130 without enabling a local I/O line coupled to the sensing circuitry.

As such, in a number of embodiments, registers and/or an ALU external to array 130 and sensing circuitry 150 may not be needed to perform the vector population count determination as the sensing circuitry 150 can be operated to perform the appropriate operations involved in performing the vector population count determination using the address space of memory array 130. Additionally, the determination of the vector population count can be performed without the use of an external processing resource.

Figure 2A:
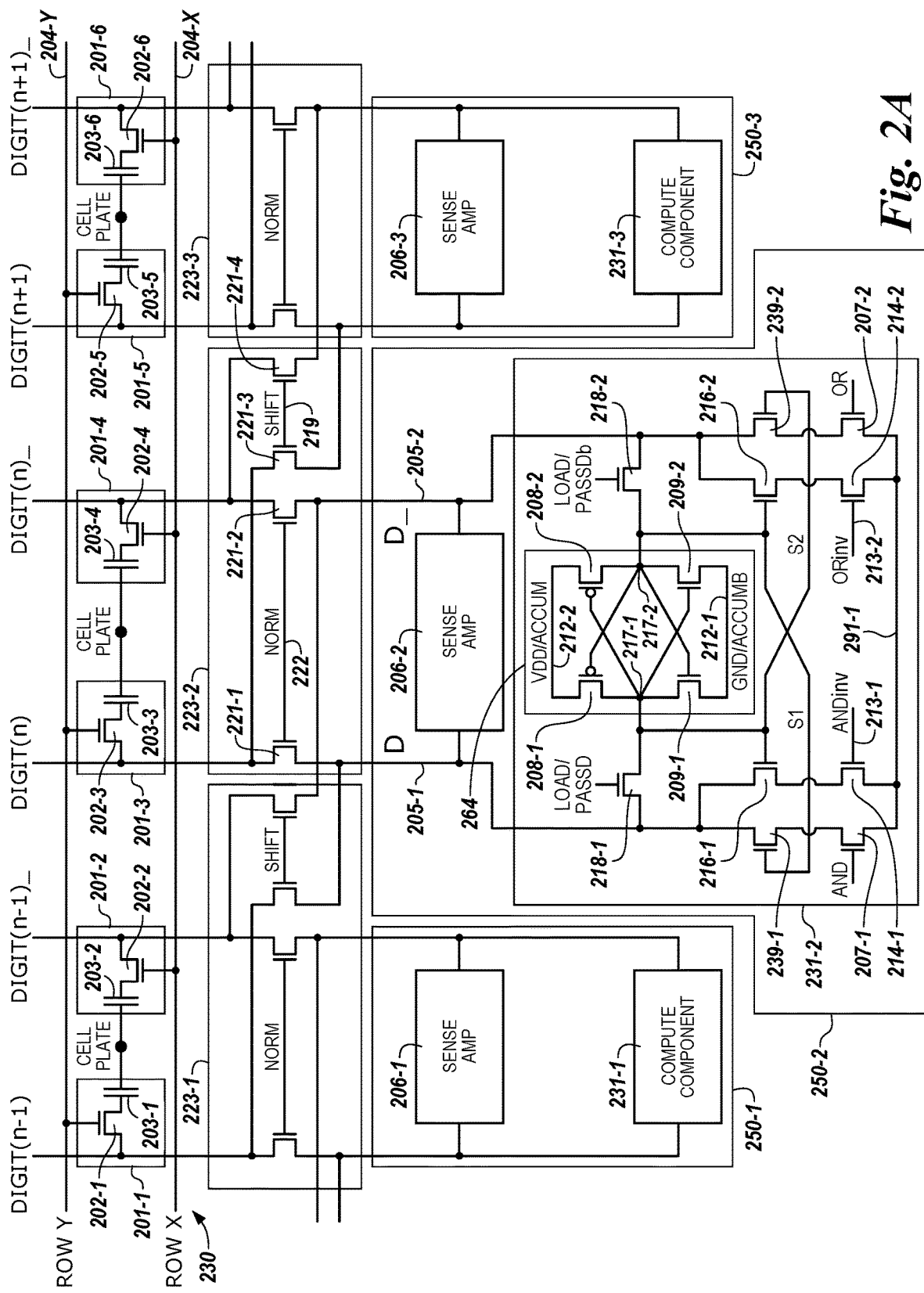
FIG. 2A illustrates a schematic diagram of a portion of a memory array in accordance with a number of embodiments of the present disclosure.

FIG. 2A illustrates a schematic diagram of a portion of a memory array 230 in accordance with a number of embodiments of the present disclosure. A memory cell comprises a storage element (e.g., capacitor) and an access device (e.g., transistor). For instance, memory cell 201-1 comprises transistor 202-1 and capacitor 203-1, memory cell 201-2 comprises transistor 202-2 and capacitor 203-2, memory cell 201-3 comprises transistor 202-3 and capacitor 203-3, and memory cell 201-4 comprises transistor 202-4 and capacitor 203-4, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-3 can be coupled to data line 205-1 (D), a second source/drain region of transistor 202-3 can be coupled to capacitor 203-3, and a gate of a transistor 202-3 can be coupled to word line 204-Y. A first source/drain region of a transistor 202-4 can be coupled to data line 205-2 (D_), a second source/drain region of transistor 202-4 can be coupled to capacitor 203-4, and a gate of a transistor 202-4 can be coupled to word line 204-X. The cell plate, as shown in FIG. 2A, can be coupled to each of capacitors 203-3 and 203-4. The cell plate can be a common node to which a reference voltage (e.g., ground) can be applied in various memory array configurations.

The memory array 230 is coupled to sensing circuitry 250-1, 250-2, 250-3, etc., in accordance with a number of embodiments of the present disclosure. Sensing circuitry comprises a sense amplifier and a compute component corresponding to respective columns of memory cells (e.g., coupled to respective pairs of complementary data lines). In this example, the sensing circuitry 250-1 comprises a sense amplifier 206-1 and a compute component 231-1 corresponding to respective columns of memory cells (e.g., memory cells 201-1 and 201-2 coupled to respective pairs of complementary data lines). Sensing circuitry 250-2 comprises a sense amplifier 206-2 and a compute component 231-2 corresponding to respective columns of memory cells (e.g., memory cells 201-3 and 201-4 coupled to respective pairs of complementary data lines). Sensing circuitry 250-3 comprises a sense amplifier 206-3 and a compute component 231-3 corresponding to respective columns of memory cells (e.g., memory cells 201-5 and 201-6 coupled to respective pairs of complementary data lines). A sense amplifier (e.g., sense amplifier 206-1) can comprise a cross coupled latch, which can be referred to herein as a primary latch. The sense amplifier (e.g., sense amplifier 206-1) can be configured, for example, as described with respect to FIG. 2B.

In the example illustrated in FIG. 2A, the circuitry corresponding to compute component 231-2 comprises a static latch 264 and an additional ten transistors that implement, among other things, a dynamic latch. For ease of reference, compute component 231-2 has been illustrated in an expanded format to describe the functioning of the compute component. Additional compute components (e.g., compute components 231-1 and 231-3) include elements of the expanded format of compute component 231-2 but are not illustrated in FIG. 2A. The dynamic latch and/or static latch of the compute component 231-2 can be collectively referred to herein as a secondary latch, which can serve as an Comp_Computator. As such, the compute component 231-2 can operate as and/or be referred to herein as a Comp_Computator. The compute component 231-2 can be coupled to each of the data lines D 205-1 and D_ 205-2 as shown in FIG. 2A. However, embodiments are not limited to this example. The transistors of compute component 231-2 can all be n-channel transistors (e.g., NMOS transistors), for example.

In this example, data line D 205-1 can be coupled to a first source/drain region of transistors 216-1 and 239-1, as well as to a first source/drain region of load/pass transistor 218-1. Data line D_ 205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage (e.g., ground (GND)). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores Comp_Compulator data dynamically on nodes S1 and S2. Activating the LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231-2 shown in FIG. 2A has the benefit of balancing the sense amplifier for functionality when the pull-down transistors 207-1, 207-2, 214-1, and 214-2 are conducting before the sense amplifier 206-2 is fired (e.g., during pre-seeding of the sense amplifier 206-2). As used herein, firing the sense amplifier 206-2 refers to enabling the sense amplifier 206-2 to set the primary latch and subsequently disabling the sense amplifier 206-2 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ANDinv control signal line 213-2) can be operated to pull-down data line 205-2 (D_).

The latch 264 can be controllably enabled by coupling to an active negative control signal line 212-1 (COMP_COMPB) and an active positive control signal line 212-2 (COMP_COMP) rather than be configured to be continuously enabled by coupling to ground and $V_{DD}$. In various embodiments, load/pass transistors 208-1 and 208-2 can each have a gate coupled to one of a LOAD control signal or a PASSD/PASSDB control signal.

According to some embodiments, the gates of load/pass transistors 218-1 and 218-2 can be commonly coupled to a LOAD control signal. In the configuration where the gates of load/pass transistors 218-1 and 218-2 are commonly coupled to the LOAD control signal, transistors 218-1 and 218-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 2A is not contingent on the LOAD control signal being elevated to a voltage greater than $V_{DD}$.

According to some embodiments, the gate of load/pass transistor 218-1 can be coupled to a PASSD control signal, and the gate of load/pass transistor 218-2 can be coupled to a PASSDB control signal. In the configuration where the gates of transistors 218-1 and 218-2 are respectively coupled to one of the PASSD and PASSDB control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent Comp_Compulator (e.g., through the shift circuitry 223-2 in memory array 230, as shown in FIG. 2A). According to some embodiments, load/pass transistors 218-1 and 218-2 can be configured to accommodate the heavier loading corresponding to a pass transistor but be coupled and operated as a load transistor. Load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231-2, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 includes four transistors 208-1, 208-2, 209-1, and 209-2 coupled to a pair of complementary data lines D 205-1 and D_ 205-2 through load/pass transistors 218-1 and 218-2. However, embodiments are not limited to this configuration. The latch 264 can be a cross coupled latch (e.g., gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2). As described further herein, the cross coupled latch 264 can be referred to as a static latch.

The voltages or currents on the respective data lines D and D_ can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
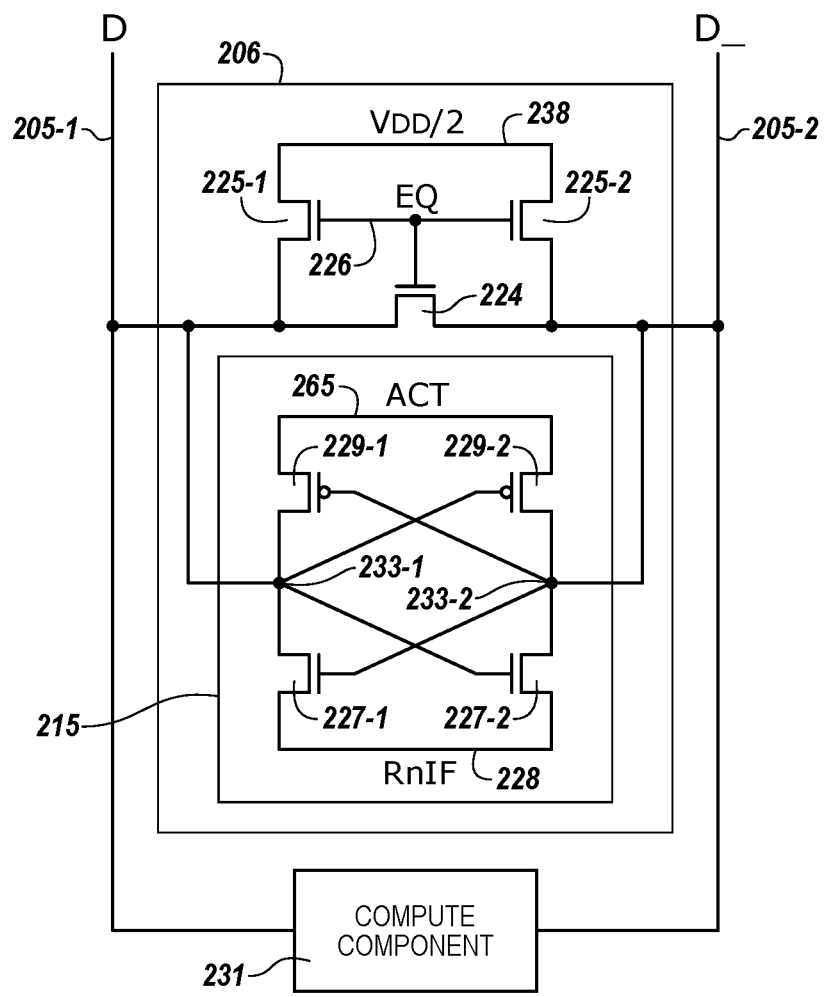
FIG. 2B is a schematic diagram illustrating a portion of sensing circuitry in accordance with a number of embodiments of the present disclosure.

In this example, a second source/drain region of transistor 209-1 and 209-2 is commonly coupled to a negative control signal line 1312-1 (e.g., ground (GND) or COMP_COMPB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or COMP_COMP control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the other of the activated positive control signal voltage (e.g., $V_{DD}$) or the activated negative control signal voltage (e.g., ground).

As shown in FIG. 2A, the sense amplifier 206-2 and the compute component 231-2 can be coupled to the array 230 via shift circuitry 223-2. In this example, the shift circuitry 223-2 comprises a pair of isolation devices (e.g., isolation transistors 221-1 and 221-2) coupled to data lines 205-1 (D) and 205-2 (D_), respectively. The isolation transistors 221-1 and 221-2 are coupled to a control signal 222 (NORM) that, when activated, enables (e.g., turns on) the isolation transistors 221-1 and 221-2 to couple the corresponding sense amplifier 206-2 and compute component 231-2 to a corresponding column of memory cells (e.g., to a corresponding pair of complementary data lines 205-1 (D) and 205-2 (D_)). According to various embodiments, conduction of isolation transistors 221-1 and 221-2 can be referred to as a "normal" configuration of the shift circuitry 223-2.

In the example illustrated in FIG. 2A, the shift circuitry 223-2 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206-2 and compute component 231-2 are coupled to a different pair of complementary data lines (e.g., a pair of complementary data lines different than the pair of complementary data lines to which isolation transistors 221-1 and 221-2 couple the particular sense amplifier 206-2 and compute component 231-2), or can couple a particular sense amplifier 206-2 and compute component 231-2 to another memory array (and isolate the particular sense amplifier 206-2 and compute component 231-2 from a first memory array). According to various embodiments, the shift circuitry 223-2 can be considered to be a portion of (e.g., within) the sensing circuitry 250-2, for instance.

Although the shift circuitry 223-2 shown in FIG. 2A includes isolation transistors 221-1 and 221-2 used to couple particular sensing circuitry 250-2 (e.g., a particular sense amplifier 206-2 and corresponding compute component 231-2) to a particular pair of complementary data lines 205-1 (D) and 205-2 (D_) (e.g., DIGIT(n) and DIGIT(n)_) and isolation transistors 221-3 and 221-4 are arranged to couple the particular sensing circuitry 250-2 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A). Shift circuitry 223-1 can include isolation transistors used to couple particular sensing circuitry 250-1 to a particular pair of complementary data lines (e.g., DIGIT(n−1) and DIGIT(n−1)_) and isolation transistors arranged to couple the particular sensing circuitry 250-1 to an adjacent pair of complementary data lines in one particular direction (e.g., adjacent data lines DIGIT(n) and DIGIT(n)_ shown in FIG. 2A). Shift circuitry 223-3 can include isolation transistors used to couple particular 250-3 to a particular pair of complementary data lines (e.g., DIGIT(n+1) and DIGIT(n+1)_) and isolation transistors arranged to couple the particular sensing circuitry 250-3 to an adjacent pair of complementary data lines in one particular direction (e.g., adjacent data lines DIGIT (n) and DIGIT(n)_ to the left and DIGIT(n+2) and DIGIT(n+2)_ to the right (not shown)).

Embodiments of the present disclosure are not limited to the configuration of shift circuitry 223-2 shown in FIG. 2A. For example, determining whether to shift in a particular direction to perform a shift operation is independent of the circuitry implementation. In a number of embodiments, shift circuitry 223-2 such as that shown in FIG. 2A can be operated (e.g., in conjunction with sense amplifiers 206-2 and compute components 231-2) in association with performing mathematical operations such as adding and subtracting operations without transferring data out of the sensing circuitry 250 via an I/O line (e.g., local I/O line (IO/IO_)), for instance.

Although not shown in FIG. 2A, each column of memory cells can be coupled to a column decode line that can be activated to transfer, via local I/O line, a data value from a corresponding sense amplifier 206-2 and/or compute component 231-2 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 223-2 can be operated in conjunction with sense amplifiers 206-2 and compute components 231-2 to perform without transferring data to a control component external to the array, for instance.

FIG. 2B is a schematic diagram illustrating a portion of sensing circuitry in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 in FIG. 2B can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206) can comprise a number of transistors formed on pitch with the transistors of the corresponding compute component 231-2 and/or the memory cells of an array (e.g., 230 shown in FIG. 2A) to which they are coupled, which may conform to a particular feature size (e.g., $4F^2$, $6F^2$, etc.). The sense amplifier 206 comprises a latch 215 including four transistors coupled to a pair of complementary data lines D 205-1 and D_ 205-2. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the secondary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231-2, which may be referred to herein as an Comp_Compulator, can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 290 (ACT). The ACT signal 290 can be a supply voltage (e.g., $V_{DD}$) and the RnIF signal can be a reference voltage (e.g., ground). Activating signals 228 and 290 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 225 (EQ). As such, activating EQ enables the transistors 224, 225-1, and 225-2, which effectively shorts data line D to data line D_ such that the data lines D and D_ are equilibrated to equilibration voltage $V_{DD}/2$. According to a number of embodiments of the present disclosure, a number of logical operations can be performed using the sense amplifier 206 and compute component 231-2, and the result can be stored in the sense amplifier and/or compute component.

The sensing circuitry 250 can be operated in several modes to perform logical operations, including a first mode in which a result of the logical operation is initially stored in the sense amplifier 206, and a second mode in which a result of the logical operation is initially stored in the compute component 231-2. Additionally with respect to the first operating mode, sensing circuitry 250 can be operated in both pre-sensing (e.g., sense amps fired before logical operation control signal active) and post-sensing (e.g., sense amps fired after logical operation control signal active) modes with a result of a logical operation being initially stored in the sense amplifier 206.

As described further below, the sense amplifier 206 can, in conjunction with the compute component 231-2, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing various operations (e.g., logical operations, mathematical operations, etc.) using less power than various previous approaches. Additionally, since a number of embodiments eliminate the need to transfer data across I/O lines in order to perform operations (e.g., between memory and discrete processor), a number of embodiments can enable an increased parallel processing capability as compared to previous approaches.

Figure 3:
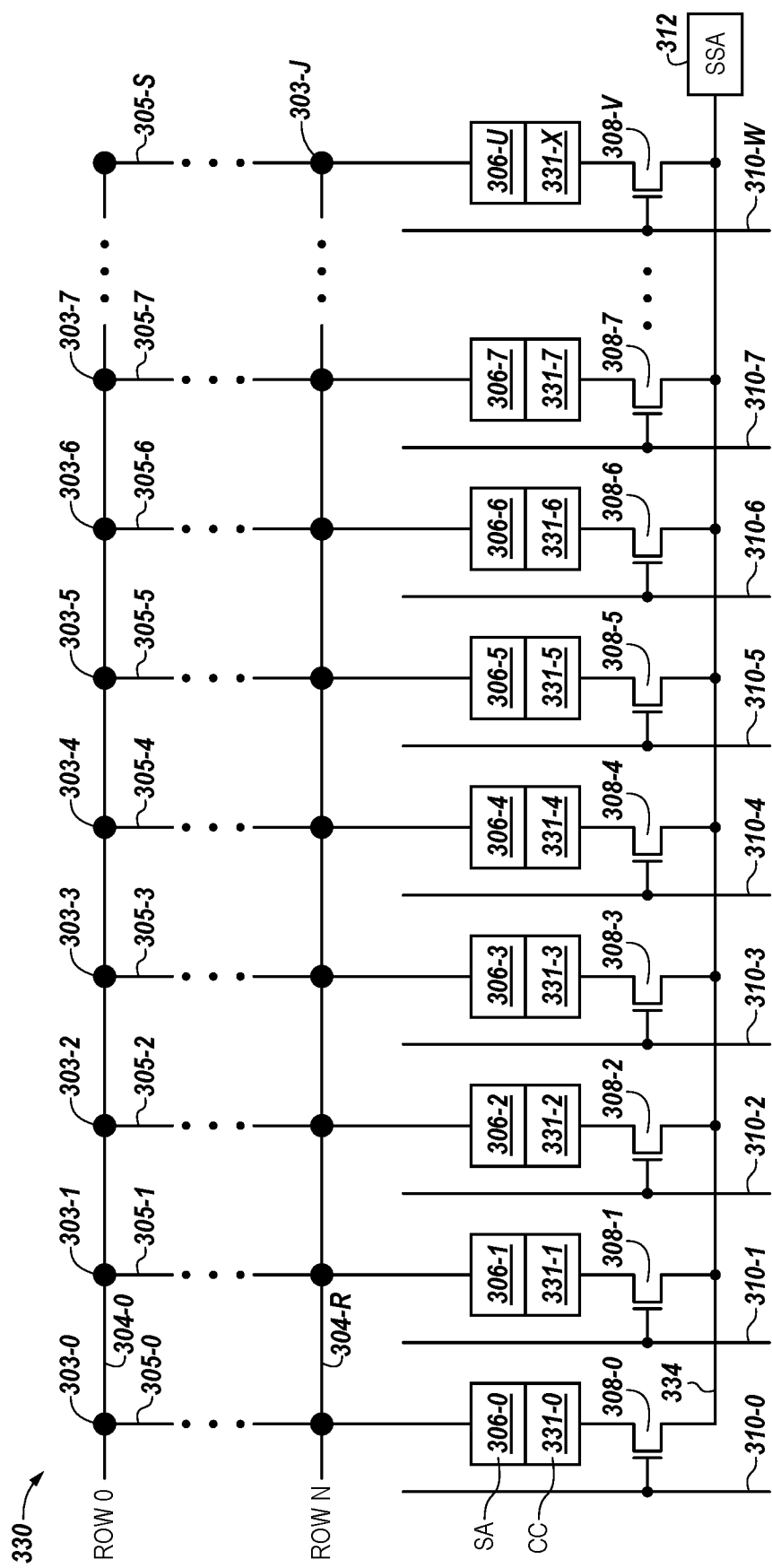
FIG. 3 illustrates a schematic diagram of a portion of a memory array in accordance with a number of embodiments of the present disclosure.

FIG. 3 illustrates a schematic diagram of a portion of a memory array 301 in accordance with a number of embodiments of the present disclosure. The array 301 includes memory cells 303-0 to 303-J (referred to generally as memory cells 303) coupled to rows of access lines 304-0, . . . , 304-R and columns of sense lines 305-0, 305-1, 305-2, 305-3, 305-4, 305-5, 305-6, 305-7, . . . , 305-S. Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1). In this example, the sensing circuitry comprises a number of sense amplifiers 306-0, 306-1, 306-2, 306-3, 306-4, 306-5, 306-6, 306-7, . . . , 306-U (refereed generally as sense amplifiers 306) coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-1, 308-2, 308-3, 308-4, 308-5, 308-6, 308-7, . . . , 308-V. In this example, the sensing circuitry also comprises a number of compute components 331-0, 331-1, 331-2, 331-3, 331-4, 331-5, 331-6, 331-7, . . . , 331-X (referred to generally as compute components 331) coupled to the respective sense lines. Column decode lines 310-1 to 310-W are coupled to the gates of transistors 308-1 to 308-V, respectively, and can be selectively activated to transfer data sensed by respective sense amps 306-0 to 306-U and/or stored in respective compute components 331-0 to 331-X to a secondary sense amplifier 312. In a number of embodiments, the compute components 331 can be formed on pitch with the memory cells of their corresponding columns and/or with the corresponding sense amplifiers 306.

The memory cells 303 can store a number of bit-vectors. For example, cells 303-0 to 303-31 can store a 32-bit bit-vector. An example 32-bit bit-vector can include bit-vector [0111 0101, 0000 0111, 0101 0000, 0101 0101]. The notation of commas in the provided example bit-vector indicates a separation of elements in the bit-vector. For example, each of the elements are eight (8) bits in length, wherein each element is separated by a comma. The example 32-bit source bit-vector includes 4 elements. The first element [0111 0101] can be stored in cells 303-0 to 303-7 and represent a numerical base sixteen (16) value of 75. The second element [0000 0111] can be stored in cells 303-8 to 303-15 and represent a numerical base sixteen (16) value of 7. The third element [0101 0000] can be stored in cells 303-16 to 303-23 and represent a numerical base sixteen (16) ten (10) value of 50. The fourth element [0101 0101] can be stored in cells 303-24 to 303-31 and represent a base sixteen (16) numerical value of 55. However, embodiments are not so limited. The example 32-bit bit-vector is provided as an example for illustrative purposes and bit-vectors are not limited to such values.

In a number of embodiments, the sensing circuitry (e.g., compute components 331 and sense amplifiers 306) is configured to perform a determination of a vector population count of a number of elements stored in array 301. As an example, a first element of a plurality of fixed length elements can be stored in a first group of memory cells (e.g., cells 303-0 to 303-7) coupled to a particular access line (e.g., 304-0) and to a first number of sense lines (e.g., 305-0 to 305-7), a second element of the plurality of fixed length elements can be stored in a second group of memory cells (e.g., cells 303-8 to 303-15) coupled to the access line (e.g., 304-0) and a second number of sense lines (e.g., 305-8 to 305-15), a third element of the plurality of fixed length elements can be stored in a third group of cells (e.g., cells 303-16 to 303-23) coupled to the access line (e.g., 304-0) and a third number of sense lines (e.g., 305-16 to 305-23), and a fourth element of the plurality of fixed length elements can be stored in a fourth group of memory cells (e.g., cells 303-24 to 303-31) coupled to the access line (e.g., 304-0) and a fourth number of sense lines (e.g., 305-24 to 305-31). While the example illustrates a fixed length of 8 bits for each of the elements, embodiments are not so limited. The fixed length elements can be $2^n$ in length, where n is a positive integer. For example, each element in a vector can be a fixed length and there can be any number of elements in a vector.

An example determination of a vector population count is described below in association with FIG. 4, which illustrates a table showing the states of memory cells of an array (e.g., 330) at a number of particular phases associated with determining a vector population count in accordance with a number of embodiments described herein. The reference numbers of the rows of the tables shown in FIG. 4 correspond to respective reference numbers of the example described below (e.g., row 451-1 corresponds to reference number 1 of the example, row 451-2 corresponds to reference number 2 of the example, etc.). Each row of the tables indicates the values of a number of bit vectors 431 (Comp_Comp), 433 (Temp_Lookup), 435 (Reduction), 437 (Elem_Mask), and 439 (Destination) at a particular phase of determining a vector population count.

The example described in association with FIG. 4 is associated with determining a population count for each element of a bit-vector stored in a group of memory cells coupled to a particular access line and to a number of sense lines. In the example described in association with FIG. 4, the bit-vector comprises 32 bits, is stored in memory cells coupled to access line 304-0 and to sense lines 305-0 to 305-31, and comprises four elements. The example bit-vector provided above (e.g., bit-vector [0111 0101, 0000 0111, 0101 0000, 0101 0101]) can be used to perform a number of calculations. For example, at least one of a multiplication, division, addition, and/or subtraction operation can be performed on the elements of the example 32-bit bit-vector. A vector population count can be used during compression algorithms and/or for security and cryptography applications when performing at least one of the operations on the example bit-vector. In order to determine a vector population count, an element mask can be provided that represents a most significant bit of each element of the bit-vector. For example, the element mask for the example 32-bit bit-vector is [1000 0000, 1000 0000, 1000 0000, 1000 0000]. The element mask can be provided or determined by performing a number of operations to determine the most significant bit of each element of a bit-vector. The element mask can be used in association with determining a vector population count, as described further herein.

The element mask in the example described in FIG. 4 is represented in binary notation as [1000 0000, 1000 0000, 1000 0000, 1000 0000], which can be represented as [0x80808080] in hexadecimal notation. The bit-vectors (e.g., 431, 433, 435, 437, 439) shown in FIG. 4 are illustrated in hexadecimal notation (e.g., as indicated by the preceding "0x"). The element mask is represented in hexadecimal notation as [0x80808080] and is shown in FIG. 4 as "0x80808080"). The first element of the element mask (e.g., the first element of the element mask corresponding to a first element of a plurality of fixed length elements) comprises 8 bits and is illustrated as "80" (e.g., bolded bit [0x80808080]), the second element of the element mask bit-vector is illustrated as "80" (e.g., [0x80808080]), the third element of the element mask bit-vector is illustrated as "80" (e.g., [0x80808080]), and the fourth element of the element mask bit-vector is illustrated as "80" (e.g., [0x80808080]). While in this example the bit-vector represents a most-significant bit of each element of the element mask bit-vector (e.g., corresponding to a plurality of fixed length elements), embodiments are not so limited. The most-significant bit-vector (e.g., referred to as an element mask and designated by Elem_Mask 437 in FIG. 4) is used for ease of reference of the most-significant bit of each element for determining a vector population count.

In this example, the bit-vectors Temp_Lookup 433, Reduction 435, Elem_Mask 437, and Destination 439 have a length of 32 bits. In this example, the four elements represented by the Elem_Mask 437 each have a fixed length. For instance, each of the four elements are represented by a respective 8-bits (e.g., each of the four elements comprise 8 bits). It is noted that although hexadecimal notation is used in FIG. 4, the bit-vectors are stored as binary data patterns in the array during the vector population count determination. Also, in the examples described herein, commas and/or spaces may be used to separate individual elements within a bit-vector. For instance, in the example above, the Elem_Mask bit-vector 437 comprises four elements which are sometimes separated by spaces to designate a differing element. Embodiments are not limited to a particular element size (e.g., to a particular number of elements and/or bits per element), although the element size can be $2^n$, where in 'n' is a positive integer. The result of the vector population count determination can be stored in an array (e.g., stored in cells coupled to access line 304-R in array 330) and/or can be transferred external to the array (e.g., to functional unit circuitry of a host).

As described further below, the result of a determination of a vector population count can be stored as a bit-vector and/or a data value in a particular group of memory cells (e.g., as Destination bit-vector 439). For instance, in the example of FIG. 4, the memory cells corresponding to Destination 439 are used to store the result of the vector population count determination (as illustrated by "0x05030204" being stored as the Destination bit-vector 439 at row 451-7.d.6 which indicates that the 5 bits of the 8 bits corresponding to the first element represent a logic value of 1, 3 bits of the 8 bits corresponding to the second element represent a logic value of 1, 2 bits of the 8 bits corresponding to the third element represent of logic value of 1, and 4 bits of the 8 bits corresponding to the fourth element represent a logic value of 1).

As described further below, the bit vectors 433 (Temp_Lookup), 435 (Reduction), 437 (Elem_Mask), and 439 (Destination) can be used in association with determining a population count of a source bit-vector (e.g., the 32-bit example bit-vector including a plurality of fixed length elements). The bit-vectors 433, 435, 437, and 439 can be stored in respective groups of memory cells coupled to particular access lines, which may be referred to as temporary storage rows (e.g., rows storing data that may be updated during various phases of a vector population count determination and may not be accessible to a user).

In the example described in association with FIG. 4, the first element of the Elem_Mask bit-vector 437 (e.g., the first of bit-vector [0x80808080]) can be stored (e.g., as an eight bit bit-vector [1000 0000]) in memory cells 303-0 to 303-7, the second element (e.g., the second of bit-vector [0x80808080]) can be stored (e.g., as an eight bit bit-vector [1000 000]) in cells 303-8 to 303-15, the third element (e.g., of bit-vector [0x80808080] can be stored (e.g., as an eight bit bit-vector [1000 0000]) in cells 303-16 to 303-23, and the fourth element (e.g., of bit-vector [0x80808080]) can be stored (e.g., as an eight bit bit-vector [1000 0000]) in memory cells 303-24 to 303-31.

In a number of examples, a determination of a vector population count includes performing a number of AND operations, shift operations, invert operations, and BlockOR operations. The determination includes performing the AND operations, shift operations, and invert operations without transferring data via an input/output (I/O) line to determine a vector population count. The number of AND operations, invert operations, and shift operations can be performed using sensing circuitry on pitch with each of a number of columns of complementary sense lines.

In a number of embodiments, a "BlockOR" operation can be performed in association with determining whether one or more (e.g., any) of the compute components (e.g., 331-0 to 331-X) and/or sense amplifiers (e.g., 306-0 to 306-U) coupled to a particular group of sense lines (e.g., 305-0 to 305-S) store a particular data value (e.g., a "1" or a "0"). For example, determining whether any of the compute components 331-0 to 331-31 coupled to sense lines 305-0 to 305-31 store a particular data value can include charging (e.g., precharging) a local I/O line such as local I/O line 334 shown in FIG. 3) to a particular voltage, and then sensing (e.g., via a secondary sense amplifier, such as SSA 312 shown in FIG. 3) whether the voltage on the local I/O line changes (e.g., by more than a threshold amount) responsive to transferring (e.g., in parallel) the voltages corresponding to the data latched in the selected compute components 331-0 to 331-31 to the local I/O line. The I/O line (e.g., I/O line 334) can be precharged via control circuitry such as control circuitry 140 shown in FIG. 1 and/or sensing circuitry such as circuitry 150 shown in FIG. 1, for instance, to a voltage such as a supply voltage (e.g., Vcc) or a ground voltage (e.g., 0V).

Transferring the voltages corresponding to the data latched in the selected compute components 331-0 to 331-31 can include activating (e.g., in parallel) the column decode lines (e.g., column decode lines 310-0 to 310-W in FIG. 3) corresponding to the selected sensing circuitry (e.g., compute components 331-0 to 331-31 in this example) such that respective transistors 308-0 to 308-31 are enabled (e.g., turned on)

As an example, to determine whether one or more of the selected compute components 331-0 to 331-31 stores (e.g., latches) a data value of "1" (e.g., a logic 1 which can be represented by a supply voltage Vcc), the I/O line (e.g., I/O line 334) can be precharged to a ground voltage (e.g., 0V, which can represent a latched data value of "0"). The corresponding column decode lines 310-0 to 310-31 can be activated, and if one or more of the selected compute components 331-0 to 331-31 stores a logic 1 (e.g., Vcc), then the SSA (e.g., SSA 312) can sense a pull up (e.g., increase) of the voltage on the I/O line (e.g., I/O line 334) which indicates that at least one of the selected compute components 331-0 to 331-31 stores a "1," which can be indicated by the BlockOR operation returning a "true" bit (e.g., "1"). In this example, if none of the compute components 331-0 to 331-31 stored a "1," then the voltage on the I/O line would not be pulled up, which can be indicated by the BlockOR operation returning a false bit (e.g., "0").

Alternatively, to determine whether one or more of the selected compute components 331-0 to 331-31 stores (e.g., latches) a data value of "0," the I/O line (e.g., I/O line 334) can be pre-charged to a supply voltage (e.g., Vcc). The corresponding column decode lines 310-0 to 310-31 can be activated, and if one or more of the selected compute components 331-0 to 331-31 stores a logic 0 (e.g., 0V), then the SSA (e.g., SSA 312) can sense a pull down (e.g., decrease) of the voltage on the I/O line (e.g., I/O line 334) which indicates that at least one of the selected compute components 331-0 to 331-31 stores a "0."

The determination of whether one or more compute components (e.g., 331-0 to 331-X) and/or sense amplifiers (e.g., 306-0 to 306-U) coupled to selected column decode lines (e.g., column decode lines 310-0 to 310-W) stores a particular data value (e.g., a data value of "1") is effectively performing a logic "OR" operation (e.g., since the operation returns a "1" if any of the data values are "1" and the operation returns a "0" only if all of the data values are "0"), which is why the operation may be referred to as a "BlockOR" operation. Embodiments of the present disclosure are not limited to particular pre-charge voltages of the local I/O line and/or to particular voltage values corresponding to logic "1" and logic "0".

The pseudo code below represents instructions executable to perform a number of operations to determine a vector population count in a memory in accordance with a number of embodiments of the present disclosure. A first portion of the pseudo code can include:

The first portion of the pseudo code listed above is associated with initializing a number of groups of memory cells for use as temporary storage rows. Initializing refers to designating and/or assigning particular access lines used to store particular bit-vectors for performing the vector population count determination. For example, the number of groups of memory cells can be initialized and/or designated groups of cells coupled to respective access lines (e.g., rows) that store data (e.g., on a temporary basis) in association with performing the vector population count determination. For example, a first group of memory cells can be coupled to a particular access line (e.g., 304-R, illustrated as ROW N) and can store a bit-vector referred to as a "Temp_Lookup" bit-vector. A second group of memory cells can be coupled to another access line (e.g., an additional access line also designated by 304-R but in addition to the initialized row for the Temp_Lookup bit-vector above) and can store a bit-vector referred to as a "Reduction" bit-vector. A third group of memory cells can be coupled to another access line (e.g., an additional access line also designated by 304-R but in addition to the initialized row for the Temp_Lookup and Reduction bit-vectors above) and can store a bit-vector referred to as an "Elem_Mask" bit-vector. A fourth group of memory cells can be coupled to another access line (e.g., an additional access line also designated by 304-R but in addition to the initialized row for the Temp_Lookup, Reduction, and Elem_Mask bit-vectors above) and can store a bit-vector referred to as a "Destination" bit-vector. Embodiments are not limited to a particular number of temporary storage rows and/or to storage of the corresponding bit-vectors on particular access lines. Also, although the groups of memory cells used to store bit-vectors may be referred to as "rows," the respective groups of memory cells may comprise fewer than all of the cells coupled to a particular access line. Furthermore, in a number of embodiments, temporary storage rows can refer to access lines which may not be addressable by a user (e.g., access lines that are outside of a user-addressable address space).

Also, the first portion pseudo code listed above (e.g., "Calculate Number of Iterations") is associated with determining how many comparison iterations to perform, wherein each iteration compares $2^I$ bits of the element. Therefore a first iteration compares the first $2^1=2$ bits of an element in the vector, a second iteration compares the first $2^2=4$ bits of an element in the vector, and a third iteration compares the first $2^3=8$ bits of an element in the vector, and so on, for example. Calculating the number of iterations includes taking the $\log_2$ of the element size, since the element size is $2^n$, the number of iterations will be $\log_2 2^n = n$ and, for example, a vector population count determination having 16 bit elements would include performing 4 iterations.

A second portion of the pseudo code can be associated with obtaining an element mask and includes:

```
Set Comp_Comp
Shift Comp_Comp Right by 1
Load Comp_Comp and Reduction with Inverse of Comp_Comp
Shift Comp_Comp Right by Element Width
Perform OR Operation with Comp_Comp and Reduction
Load Comp_Comp in Elem_Mask and Reduction
```

The second portion of the pseudo code above illustrates obtaining an element mask, which represents a most significant bit of each of the elements of the number of fixed length elements. As an example, a bit pattern comprising a "1" in a MSB position and all "0s" in the remaining bit positions can be used to indicate the MSBs of the constituent elements of a source bit-vector (e.g., example 32-bit bit-vector described above). Obtaining the element mask includes a number of steps, corresponding to pseudo code above. Set Comp_Comp corresponds to the setting the latches of the compute components to all logical 1's. Shift Comp_Comp Right by 1 corresponds to the shifting of the bits of Comp_Comp to the right by 1 place. Load Comp_Comp and Reduction with Inverse of Comp_Comp corresponds to the taking the inverse of the shifted vector in Comp_Comp and storing the inverse of the Comp_Comp in the Comp_Comp and in Reduction. Shift Comp_Comp Right by Element Width and Perform OR Operation with Comp_Comp and Reduction corresponds to shifting the Comp_Comp by the element width and performing an OR operation with the vector stored in Reduction. The process of shifting by the element width and performing the OR operation is done a number of times until the values of the Comp_Comp vector have been shifted through the entire vector. Once the values of the Comp_Comp vector have been shifted through the entire vector, then next step in the pseudo code can be performed. Load Comp_Comp in Elem_Mask and Reduction corresponds to loading the vector from the Comp_Comp, which is the element mask that has been calculated according to the pseudo code listed described, into Elem_Mask and Reduction. These vectors in Elem_Mask and Reduction will be used during the third portion of the pseudo code, which will be described below.

The remaining portions of the pseudo code, the third, fourth, and fifth portions, described below can be performed a number of times. The pseudo code below can be performed as part of each iteration in determining a vector population count. For example, the pseudo code below can be performed as part of a first iteration and the output from the first iteration can be used while performing the pseudo code below as part of a second iteration, and so on, until all the iterations are complete and the output of the final iteration is the vector population count.

A third portion of the pseudo code can be associated with obtaining a reduction bit-vector and includes:

```
Load Elem_Mask in Reduction
Load Elem_Mask in Comp_Comp
Shift Comp_Comp Right by 2^(I-1)
Perform OR Operation with Comp_Comp and Reduction
Load Comp_Comp in Temp_Lookup
Shift Comp_Comp Right by 2*I
Perform OR Operation with Comp_Comp and Temp_Lookup
Load Comp_Comp in Reduction
```

The third portion of the pseudo code above illustrates obtaining a reduction bit-vector. Load Elem_Mask in Reduction corresponds to loading Reduction with the element mask and Load Elem_Mask in Comp_Comp corresponds to loading Comp_Comp with the element mask. Each iteration that includes the pseudo code above includes calculating the shift that can be performed for the iteration, which corresponds to $2^{I-1}$. A first loop of shifting the vector in the Comp_Comp and performing an OR operation with the vector in the Reduction can be performed. Each iteration includes performing the first loop from c to the c=2. A second loop of shifting the vector in the Comp_Comp by 2*I, and performing an OR operation with the vector in Temp_Lookup. Each iteration includes determining the reduction vector width, which is $2^I$, and the efficient ratio, which is the element size divided by the reduction vector width. Each iteration includes performing the second loop from c to the efficient ratio.

Load Elem_Mask in Reduction corresponds to loading the element mask in Temp_Lookup and Shift Comp_Comp Right by $2^{I-1}$ corresponds to shifting the bits of the element mask stored in Comp_Comp to the right by $2^{I-1}$ places. Perform OR operation with Comp_Comp and Reduction corresponds to performing an OR operation with the vectors in Comp_Comp and Reduction. Load Comp_Comp in Temp_Lookup corresponds to loading the result of the OR operation of the vectors in Comp_Comp and Reduction discussed above in Temp_Lookup. Shift Comp_Comp Right by 2*I corresponds to shifting the vector stored in Comp_Comp to the right 2*I places. Perform OR operation with Comp_Comp and Temp_Lookup corresponds to performing an OR operation with the vectors in Comp_Comp and Temp_Lookup. Load Comp_Comp in Reduction corresponds to loading the result of the OR operation of the vectors in Comp_Comp and Temp_Lookup discussed above in Reduction, which is the reduction bit-vector for an iteration of the pseudo code above.

A fourth portion of the pseudo code can be associated with obtaining a pattern mask and includes:

---
Perform AND Operation with Comp_Comp and Destination
Shift Comp_Comp Right by 1
Load Comp_Comp in Temp_Lookup
Load Inverse of Reduction in Comp_Comp
Perform AND Operation with Comp_Comp and Destination
Load Comp_Comp in Destination
---

The fourth portion of the pseudo code above illustrates obtaining a pattern mask. The pattern mask can include a first portion and a second portion. Determining the first portion of the pattern mask includes Perform AND Operation with Comp_Comp and Destination, which corresponds to performing an AND operation with the reduction vector and the destination. For a first iteration, the destination is the source vector for the vector population count determination and for each subsequent iteration the destination is the output of the previous iteration. Shift Comp_Comp Right by $2^{I-1}$ corresponds to shifting the result of the AND operation with the reduction vector and source vector that is stored in Comp_Comp to the right $2^{I-1}$ places. When generating the first portion of the pattern mask, the vector in the Comp_Comp that resulted from performing an AND operation with the reduction vector and the destination is shifted $2^{I-1}$ places. Load Comp_Comp in Temp_Lookup corresponds to loading the shifted vector from Comp_Comp to Temp_Lookup which is the first portion of the pattern mask. Determining the second portion of the pattern mask includes Load Inverse of Reduction in Comp_Comp, which corresponds to loading the inverse of Reduction in Comp_Comp. Perform AND Operation with Comp_Comp and Destination corresponds to performing an AND operation with the inverse of the reduction vector for the first iteration and the destination For a first iteration, the destination is the source vector for the vector population count determination and for each subsequent iteration the destination is the output of the previous iteration. Load Comp_Comp in Destination corresponds to loading the result of the AND operation from the inverse of the reduction vector and the destination to Destination, which is the second portion of the pattern mask.

A fifth portion of the pseudo code can be associated with performing a half add operation of the first and second portions of a pattern mask and includes:

---
Perform Half Add Operation with Comp_Comp and Destination
Shift Comp_Comp Left by 1
Check For Carry Values in Comp_Comp
---

The fifth portion of the pseudo code above illustrates obtaining an output for an iteration of the pseudo code by performing a half add operation with the first and second portions of the pattern mask. Perform a Half Add operation with Comp_Comp and Destination corresponds to performing a Half Add operation of the first portion of the pattern mask in Comp_Comp and the second portion of the pattern mask in Destination. The sum portion of the half add operation is stored in Destination and the carry portion of the half add operation is stored in Comp_Comp. Comp_Comp Left by 1 corresponds to shifting the carry of the half add operation described above to the left by 1. Check for Carry Values in Comp_Comp corresponds to checking for any carry values that remain in the Comp_Comp after a half add and shift is performed. A BlockOR operation may be performed to check if carry values remain in the Comp_Comp. In this example, the BlockOR operation is determining whether a data value of "1" is stored in at least one compute component. If there are carry values remaining in the Comp_Comp, as indicated by the BlockOR operation, then a number of half add and shift operations are performed until carry values are no longer remaining in the Comp_Comp. An iteration is complete when there are no longer carry values in the Comp_Comp and the Destination is the output for the iteration.

The steps below represent an example of performing the pseudo code associated with determining a vector population count in a memory in accordance with a number of embodiments of the present disclosure. The example is referenced using reference numbers 1-7, which correspond to the reference numbers of the rows shown in the tables of FIG. 4. For instance, reference number 1 (e.g., "Obtain Temp Rows") corresponds to row 451-1, reference number 3 (e.g., "Set Comp_Comp") corresponds to row 451-3.a, and reference number 5.a.2 (e.g., "Load Elem_Mask in Comp_Comp") corresponds to rows 451-5.a.2, as illustrated in FIG. 4.

---
Vector Population Count Determination Example

1. Obtain Temp Rows
2. Calculate Number of Iterations
3. Obtain Elem_Mask
   3.a Set Comp_Comp
   3.b Shift Comp_Comp Right by 1
   3.c Load Comp_Comp and Reduction with Inverse of Comp_Comp
   3.d Shift Comp_Comp Right by Element Width
   3.e Perform OR Operation with Comp_Comp and Reduction
   3.f Shift Comp_Comp Right by Element Width
   3.g Perform OR Operation with Comp_Comp and Reduction

| Vector Population Count Determination Example |
| --- |
| 3.h Shift Comp_Comp Right by Element Width |
| 3.i Perform OR Operation with Comp_Comp and Reduction |
| 3.j Load Comp_Comp in Elem_Mask and Reduction |
| 4. Load Source Vector in Destination |
| 5. Perform First Iteration |
|     5.a Obtain Reduction |
|         5.a.1 Load Elem_Mask in Reduction |
|         5.a.2 Load Elem_Mask in Comp_Comp |
|         5.a.3 Load Comp_Comp in Temp_Lookup |
|         5.a.4 Shift Comp_Comp Right by 2 |
|         5.a.5 Perform OR Operation with Comp_Comp and Temp_Lookup |
|         5.a.6 Load Comp_Comp in Temp_Lookup |
|         5.a.7 Shift Comp_Comp Right by 2 |
|         5.a.8 Perform OR Operation with Comp_Comp and Temp_Lookup |
|         5.a.9 Load Comp_Comp in Temp_Lookup |
|         5.a.10 Shift Comp_Comp Right by 2 |
|         5.a.11 Perform OR operation with Comp_Comp and Temp_Lookup |
|         5.a.12 Load Comp_Comp in Temp_Lookup |
|         5.a.13 Load Comp_Comp in Reduction |
|     5.b Obtain First Portion of Pattern |
|         5.b.1 Perform AND Operation with Comp_Comp and Destination |
|         5.b.2 Shift Comp_Comp Right by 1 |
|         5.b.3 Load Comp_Comp in Temp_Lookup |
|     5.c Obtain Second Portion of Pattern |
|         5.c.1 Load Inverse of Reduction in Comp_Comp |
|         5.c.2 Perform AND Operation with Comp_Comp and Destination |
|         5.c.3 Load Comp_Comp in Destination |
|     5.d Perform a Half Add with the First Portion and Second Portion of Pattern |
|         5.d.1 Perform Half Add Operation with Temp_Lookup and Destination |
|         5.d.2 Shift Comp_Comp Left by 1 |
|         5.d.3 Check For Carry Values in Comp_Comp |
|         5.d.4 Perform Half Add Operation with Comp_Comp and Destination |
|         5.d.5 Shift Comp_Comp Left by 1 |
|         5.d.6 Check For Carry Values in Comp_Comp |
| 6. Perform Second Iteration |
|     6.a Obtain Reduction |
|         6.a.1 Load Elem_Mask in Reduction |
|         6.a.2 Load Elem_Mask in Comp_Comp |
|         6.a.3 Shift Comp_Comp Right by 1 |
|         6.a.4 Perform OR Operation with Comp_Comp and Reduction |
|         6.a.5 Load Comp_Comp in Temp_Lookup |
|         6.a.6 Shift Comp_Comp Right by 4 |
|         6.a.7 Perform OR Operation with Comp_Comp and Temp_Lookup |
|         6.a.8 Load Comp_Comp in Temp_Lookup |
|         6.a.9 Load Comp_Comp in Reduction |
|     6.b Obtain First Portion of Pattern |
|         6.b.1 Perform AND Operation with Comp_Comp and Destination |
|         6.b.2 Shift Comp_Comp Right by 2 |
|         6.b.3 Load Comp_Comp in Temp_Lookup |
|     6.c Obtain Second Portion of Pattern |
|         6.c.1 Load Inverse of Reduction in Comp_Comp |
|         6.c.2 Perform AND Operation with Comp_Comp and Destination |
|         6.c.3 Load Comp_Comp in Destination |
|     6.d Perform a Half Add with the First Portion and Second Portion of Pattern |
|         6.d.1 Perform Half Add Operation with Temp_Lookup and Destination |
|         6.d.2 Shift Comp_Comp Left by 1 |
|         6.d.3 Check For Carry Values in Comp_Comp |
|         6.d.4 Perform Half Add Operation with Comp_Comp and Destination |
|         6.d.5 Shift Comp_Comp Left by 1 |
|         6.d.6 Check For Carry Values in Comp_Comp |
| 7. Perform Third Iteration |
|     7.a Obtain Reduction |
|         7.a.1 Load Elem_Mask in Reduction |
|         7.a.2 Load Elem_Mask in Comp_Comp |
|         7.a.3 Shift Comp_Comp Right by 1 |
|         7.a.4 Perform OR Operation with Comp_Comp and Reduction |
|         7.a.5 Shift Comp_Comp Right by 1 |
|         7.a.6 Perform OR Operation with Comp_Comp and Reduction |
|         7.a.7 Shift Comp_Comp Right by 1 |
|         7.a.8 Perform OR Operation with Comp_Comp and Reduction |
|         7.a.9 Load Comp_Comp in Temp_Lookup |
|         7.a.10 Load Comp_Comp in Reduction |
|     7.b Obtain First Portion of Pattern |
|         7.b.1 Perform AND Operation with Comp_Comp and Destination |
|         7.b.2 Shift Comp_Comp Right by 4 |
|         7.b.3 Load Comp_Comp in Temp_Lookup |
|     7.c Obtain Second Portion of Pattern |
|         7.c.1 Load Inverse of Reduction in Comp_Comp |
|         7.c.2 Perform AND Operation with Comp_Comp and Destination |
|         7.c.3 Load Comp_Comp in Destination |
|     7.d Perform a Half Add with the First Portion and Second Portion of Pattern |
|         7.d.1 Perform Half Add Operation with Temp_Lookup and Destination |
|         7.d.2 Shift Comp_Comp Left by 1 |
|         7.d.3 Check For Carry Values in Comp_Comp |
|         7.d.4 Perform Half Add Operation with Comp_Comp and Destination |
|         7.d.5 Shift Comp_Comp Left by 1 |
|         7.d.6 Check For Carry Values in Comp_Comp |

For purposes of discussion, the example above will be divided into a setup phase and a determination phase associated with determining a vector population count. The steps referenced by reference numbers 1-4 can correspond to the setup phase. In the example illustrated in FIGS. 4A-4D, a bit-vector value illustrated in bold indicates a change in the value of the bit-vector (e.g., the value of the bit-vector stored in the memory cells corresponding to Comp_Comp 431 is shown in bold in FIG. 4B to indicate a change to [0x20202020] as shown in row 451-5.4*a* from [0x80808080] as shown in row 451-5.*a*.3. FIG. 4A illustrates the values of a number of bit-vectors associated with performing the setup phase, as indicated by reference numbers 1-4, and FIGS. 4B-4D illustrate the values of a number of bit-vectors associated with performing a determination phase, as indicated by reference number 5-7, of a vector population count determination.

Rows 451-1 to 451-4 of the table in FIG. 4A correspond to instructions referenced by respective reference numbers 1 to 4 in the example above. As such, rows 451-1 to 451-4 indicate values of the bit vectors 433, 435, 437, and 439 during execution of the setup phase as described by the example above. Reference number 1 (e.g., "Obtain Temp Rows") of the example above is associated with initializing a number of groups of memory cells for use as temporary storage rows. Initializing refers to designating and/or assigning particular access lines used to store particular bit-vectors for performing the vector population count determination. For example, the number of groups of memory cells can be initialized and/or designated groups of cells coupled to respective access lines (e.g., rows) that store data (e.g., on a temporary basis) in association with performing the vector population count determination. For example, a first group of memory cells can be coupled to a particular access line (e.g., 304-R, illustrated as ROW N) and can store a bit-vector referred to as a "Temp_Lookup" bit-vector 433. A second group of memory cells can be coupled to another access line (e.g., an additional access line also designated by 304-R but in addition to the initialized row for the Temp_Lookup bit-vector above) and can store a bit-vector referred to as a "Reduction" bit-vector 435. A third group of memory cells can be coupled to another access line (e.g., an additional access line also designated by 304-R but in addition to the initialized row for the Temp_Lookup and Reduction bit-vectors above) and can store a bit-vector referred to as an "Elem_Mask" bit-vector 437. A fourth group of memory cells can be coupled to another access line (e.g., an additional access line also designated by 304-R but in addition to the initialized row for the Temp_Lookup, Reduction, and Elem_Mask bit-vectors above) and can store a bit-vector referred to as a "Destination" bit-vector 437. Embodiments are not limited to a particular number of temporary storage rows and/or to storage of the corresponding bit-vectors on particular access lines. Also, although the groups of memory cells used to store bit-vectors 433, 435, 437, and 439 may be referred to as "rows," the respective groups of memory cells may comprise fewer than all of the cells coupled to a particular access line. Furthermore, in a number of embodiments, temporary storage rows can refer to access lines which may not be addressable by a user (e.g., access lines that are outside of a user-addressable address space).

Reference number 2 (e.g., "Calculate Number of Iterations") of the example above is associated with determining how many comparison iterations to perform in the example, wherein each iteration compares $2^I$ bits of the element. Therefore the first iteration compares the first $2^1=2$ bits of an element in the vector, the second iteration compares the first $2^2=4$ bits of an element in the vector, and the third iteration compares the first $2^3=8$ bits of an element in the vector, and so on, for example. Calculating the number of iterations includes taking the $\log_2$ of the element size. In the example illustrated in FIG. 4, the element size is 8, therefore the number of iterations to be performed in this example is $\log_2 8=3$. In a number of embodiments, since the element size is $2^n$, the number of iterations will be $\log_2 2^n = n$ and, for example, a vector population count determination having 16 bit elements would include performing 4 iterations.

Reference number 3 (e.g., "Obtain Elem_Mask") of the example above is associated with calculation of an elemental mask (e.g., [0x80808080]) and storing the elemental mask as the Elem_Mask bit-vector 437. The Elem_Mask 437 represents a most significant bit of each of the elements of the number of fixed length elements. As an example, a bit pattern (e.g., the element mask referred to as Elem_Mask 437 in FIG. 4) comprising a "1" in a MSB position and all "0s" in the remaining bit positions can be used to indicate the MSBs of the constituent elements of a source bit-vectors (e.g., example 32-bit bit-vector described above). Obtaining the Elem_Mask includes a number of steps, corresponding to reference numbers 3.a-3.j of this example. Reference number 3.a of the example above (e.g., "Set Comp_Comp") corresponds to the setting the latches of the compute components storing Comp_Comp 431 to all logical 1's, as illustrated line 451-3.a in FIG. 4 as "0xFFFFFFFF". Reference number 3.b of the example above (e.g., "Shift Comp_Comp Right by 1") corresponds to the shifting of the bits of Comp_Comp 431 to the right by 1 place, as illustrated line 451-3.b in FIG. 4 as "0x7F FF FF FF". Reference number 3.c of the example above (e.g., "Load Comp_Comp and Reduction with Inverse of Comp_Comp") corresponds to the taking the inverse of "0x7FFFFFFF", which is the current value of Comp_Comp 431, and storing the inverse of the Comp_Comp 431 in the Comp_Comp 431 and in Reduction 435, as illustrated line 451-3.c in FIG. 4 as "0x80000000". The next steps in calculating the Elem_Mask, steps 3.d-3.j, include shifting the Comp_Comp vector 431 by the element width and performing an OR operation with the vector stored in Reduction 435. The process of shifting by the element width and performing the OR operation is done a number of times until the values of the Comp_Comp vector 431 have been shifted through the entire vector. In the example illustrated in FIG. 4, the shift and OR operation is completed 3 times as the values from the first element in Comp_Comp 431 are shifted to the second element, the third element, and then the fourth element. Reference numbers 3.d and 3.e of the example above (e.g., "Shift Comp_Comp Right by Element Width" and "Perform OR Operation with Comp_Comp and Reduction) corresponds to the first shift and OR operation, which includes shifting Comp_Comp to the right 8 bits, as illustrated in line 451-3.d of FIG. 4 as "0x00800000", and also performing and OR operation with the vectors in Comp_Comp 431 and Reduction 435, as illustrated in line 451-3.e of FIG. 4 as "0x80800000". Reference numbers 3.f and 3.g of the example above (e.g., "Shift Comp_Comp Right by Element Width" and "Perform OR Operation with Comp_Comp and Reduction) corresponds to the second shift and OR operation, which includes shifting Comp_Comp to the right 8 bits, as illustrated in line 451-3.f of FIG. 4 as "0x00808000", and also performing an OR operation with the vectors in Comp_Comp 431 and Reduction 435, as illustrated in line 451-3.g of FIG. 4 as "0x80808000". Reference numbers 3.h and 3.i of the example above (e.g., "Shift Comp_Comp Right by Element Width" and "Perform OR Operation with Comp_Comp and Reduction) corresponds to the third shift and OR operation, which includes shifting Comp_Comp to the right 8 bits, as illustrated in line 451-3.h of FIG. 4 as "0x00808080", and also performing and OR operation with the vectors in Comp_Comp 431 and Reduction 435, as illustrated in line 451-3.i of FIG. 4 as "0x80808080". Reference number 3.j (e.g., "Load Comp_Comp in Elem_Mask and Reduction") corresponds to loading the vector from the Comp_Comp 431, which is the element mask that has been calculated according to reference numbers 3.a-3.i and described above, into Elem_Mask 437 and Reduction 435. These vectors in Elem_Mask 437 and Reduction 435 will be used during a number of iterations of this example, which will be described below.

Reference number 4 (e.g., "Load Source Vector in Destination") of the example above is associated with loading the vector that will be analyzed during the vector population count determination to Destination 439. The example source bit-vector is [0111 0101, 0000 0111, 0101 0000, 0101 0101] and is stored in Destination as [0x75075055]. The source vector is loaded in Destination 439 and used during a number of iterations of this example, which are described below. At the conclusion of the setup phase corresponding to reference numbers 1-4 of the example above, and as shown in row 451-4 of FIG. 4, bit-vector Comp_Comp 431 stores a value of [0x80808080], the bit-vector Temp_Lookup 435 stores a value of [0x0] (e.g., [0x00000000]), the bit-vector Reduction 435 stores a value of [0x80808080], the bit-vector Elem_Mask stores bit a value of [0x80808080], and the bit-vector Destination stores value of [0x75075055].

Reference numbers 5-7 of the example above (e.g., "Perform First Iteration") corresponds to the determination phase of a vector population count determination in accordance with a number of embodiments of the present disclosure. The determination phase can comprise performing a number of iterations corresponding to reference numbers 5-7. The number of iterations for determining a vector population count is dependent on the size of the elements in the vector. The number of iterations to determine a vector population count is equal to the $\log_2$ of the element size, which is $\log_2 8=3$ in the example above. In the example above, reference number 5 corresponds to a first iteration that comprises execution of the steps corresponding to reference numbers 5.*a*-5.*d*, reference number 6 corresponds to a second iteration that comprises execution of the steps corresponding to reference numbers 6.*a*-6.*d*, and reference number 7 corresponds to a third iteration that comprises execution of the steps corresponding to reference numbers 7.*a*-7.*d*.

Reference number 5 of the example (e.g., Perform First Iteration") corresponds to the first iteration of the determination phase. The first iteration compares the first two bits of each element when executing the example above to determine the vector population count. At reference number 5.*a* (e.g., "Obtain Reduction"), a reduction vector for the first iteration is obtained. Reference numbers 5.*a*.1-5.*a*.9 correspond to the calculation of the reduction vector for the first iteration. The reduction vector is used during subsequent steps of the first iteration.

Reference number 5.*a*.1 of the example above (e.g., "Load Elem_Mask in Reduction") corresponds to loading Reduction 435 with the element mask, as illustrated line 451-5.*a*.1 in FIG. 4 as "0x80808080". Reference number 5.*a*.2 of the example above (e.g., "Load Elem_Mask in Comp_Comp") corresponds to loading Comp_Comp 431 with the element mask, as illustrated line 451-5.*a*.2 in FIG. 4 as "0x80808080". Each iteration includes calculating the shift for the iteration, which corresponds to 2I-1. In the first iteration, the shift is 1, which corresponds to the first two bits of each element are being compared. In the first iteration, a first loop of shifting the vector in the Comp_Comp 431 by 1 and performing an OR operation with the vector in the Reduction 435 is skipped because c=2 and is greater than the shift of 1. The second loop of shifting the vector in the Comp_Comp includes shifting the Comp_Comp 431 by 2*I, which is 2*1=2 for the first iteration, and performing an OR operation with the vector in Temp_Lookup 433. Each iteration includes determining the reduction vector width, which is $2^I$, and the efficient ration, which is the element size divided by the reduction vector width. In the first iteration, the reduction vector width is $2^I=2$ and the efficient ratio is 8/2-4. Each iteration includes performing the second loop from c to the efficient ratio. In the first iteration, the second loop is performed 3 times, as c=2 and the efficient ratio is 4. The second loop of the first iteration corresponds to reference numbers 5.*a*.3-5.*a*.13.

Reference number 5.*a*.3 of the example above (e.g., "Load Elem_Mask in Temp_Lookup") corresponds to loading the element mask in Temp_Lookup 433, as illustrated line 451-5.*a*.3 in FIG. 4 as "0x80808080". Reference number 5.*a*.4 of the example above (e.g., "Shift Comp_Comp Right by 2") corresponds to shifting the bits of the element mask stored in Comp_Comp 431 to the right two places, as illustrated line 451-5.*a*.4 in FIG. 4 as "0x20202020". Reference number 5.*a*.5 of the example above (e.g., "Perform OR operation with Comp_Comp and Temp_Lookup") corresponds to performing an OR operation with the vectors in Comp_Comp 431 and Temp_Lookup 433, as illustrated in line 451-5.*a*.5 of FIG. 4 as "0xA0A0A0A0". Reference number 5.*a*.6 of the example above (e.g., "Load Comp_Comp in Temp_Lookup") corresponds to loading the result of the OR operation of the vectors in Comp_Comp 431 and Temp_Lookup 433 discussed above in Temp_Lookup, as illustrated line 451-5.*a*.5 in FIG. 4 as "0xA0A0A0A0". Reference number 5.*a*.7 of the example above (e.g., "Shift Comp_Comp Right by 2") corresponds to shifting the vector stored in Comp_Comp 431 to the right two places, as illustrated line 451-5.*a*.4 in FIG. 4 as "0x28282828". Reference number 5.*a*.8 of the example above (e.g., "Perform OR operation with Comp_Comp and Temp_Lookup") corresponds to performing an OR operation with the vectors in Comp_Comp 431 and Temp_Lookup 433, as illustrated in line 451-5.*a*.8 of FIG. 4 as "0xA8A8A8A8". Reference number of the example above (e.g., "Load Comp_Comp in Temp_Lookup") corresponds to loading the result of the OR operation of the vectors in Comp_Comp 431 and Temp_Lookup 433 discussed above in Temp_Lookup 433, as illustrated line 451-5.*a*.9 in FIG. 4 as "0xA8A8A8A8". Reference number 5.*a*.10 of the example above (e.g., "Shift Comp_Comp Right by 2") corresponds to shifting the vector stored in Comp_Comp 431 to the right two places, as illustrated line 451-5.*a*.4 in FIG. 4 as "0x2A2A2A2A". Reference number 5.*a*.11 of the example above (e.g., "Perform OR operation with Comp_Comp and Temp_Lookup") corresponds to performing an OR operation with the vectors in Comp_Comp 431 and Temp_Lookup 433, as illustrated in line 451-5.*a*.11 of FIG. 4 as "0xAAAAAAAA". Reference number 5.*a*.12 of the example above (e.g., "Load Comp_Comp in Temp_Lookup") corresponds to loading the result of the OR operation of the vectors in Comp_Comp 431 and Temp_Lookup 433 discussed above in Temp_Lookup 433, as illustrated line 451-5.*a*.12 in FIG. 4 as "0xAAAAAAAA". Reference number 5.*a*.13 of the example above (e.g., "Load Comp_Comp in Reduction") corresponds to loading the result of the OR operation of the vectors in Comp_Comp 431 and Temp_Lookup 433 discussed above in Reduction 435, as illustrated line 451-5.*a*.13 in FIG. 4 as "0xAAAAAAAA", which is the reduction vector for the first iteration.

Reference number 5.*b* of the example above (e.g., Obtain First Portion of Pattern") corresponds to creating the pattern mask for first iteration of the determination phase. Reference numbers 5.*b*.1-5.*b*.3 correspond to the calculation of the first portion of the pattern mask for the first iteration. The first portion of the pattern mask is used during subsequent steps of the first iteration.

Reference number 5.*b*.1 of the example above (e.g., "Perform AND Operation with Comp_Comp and Destination") corresponds to performing an AND operation with the reduction vector for the first iteration and the destination, which is the source vector for the vector population count determination, as illustrated in line 451-5.*b*.1 in FIG. 4 as "0x20020000". As an example, the result of a logical AND operation performed on a first bit-vector "a" (e.g., [$a_0$ $a_1$ $a_2$ $a_3$ $a_4$ $a_5$]) and a second bit-vector "b" (e.g., [$b_0$ $b_1$ $b_2$ $b_3$ $b_4$ $b_5$]) is a bit-vector "c" (e.g., [$c_0$ $c_1$ $c_2$ $c_3$ $c_4$ $c_5$]), wherein $c_0=a_0$ AND $b_0$, $c_1=a_1$ AND $b_1$, $c_2=a_2$ AND $b_2$, $c_3=a_3$ AND $b_3$, $c_4$ $a_4$ AND $b_4$, and $c_5=a_5$ AND $b_5$. For instance, performing an AND operation on a bit-vector [101010] and on bit-vector [100010] would result in bit-vector [100010] (e.g., the leftmost bit of the resultant bit-vector is "1" since "1" AND "1" is "1", the next bit is "0" since "0" AND "0" is "0", the next bit is "0" since "1" AND "0" is "0", the next bit is "0" since "0" AND "0" is "0", the next bit is "1" since "1" AND "1" is "1", and the rightmost bit is "0" since "0" AND "0" is "0"). Reference number 5.*b*.2 of the example above (e.g., "Shift Comp_Comp Right by 1") corresponds to shifting the result of the AND operation with the reduction vector and source vector that is stored in Comp_Comp 431 to the right one place, as illustrated line 451-5.*b*.2 in FIG. 4 as "0x10010000". When generating the pattern mask, the vector in the Comp_Comp 431 that resulted from performing an AND operation with the reduction vector and the destination is shifted $2^{I-1}$ places. In the example of FIG. 4, the vector in the Comp_Comp 431 is shifted right 1 place during the first iteration. Reference number 5.*b*.3 of the example above (e.g., "Load Comp_Comp in Temp_Lookup") corresponds to loading the shifted vector from Comp_Comp 431 to Temp_Lookup 433, as illustrated in line 451-5.*b*.3 of FIG. 4 as "0x10010000". This vector "0x10010000" in Temp_Lookup 433 of line 451.*b*.3 is the first portion of the pattern mask for the first iteration.

Reference number 5.*c* of the example above (e.g., Obtain Second Portion of Pattern") corresponds to creating the pattern mask for first iteration of the determination phase. Reference numbers 5.*c*.1-5.*c*.3 correspond to the calculation of the second portion of the pattern mask for the first iteration. The second portion of the pattern mask is used during subsequent steps of the first iteration.

Reference number 5.*c*.1 of the example above (e.g., "Load Inverse of Reduction in Comp_Comp") corresponds to loading the inverse of Reduction 435 (e.g., the reduction vector) in Comp_Comp 431, as illustrated in line 451-5.*b*.1 in FIG. 4 as "0x55555555". Reference number 5.*c*.2 of the example above (e.g., "Perform AND Operation with Comp_Comp and Destination") corresponds to performing an AND operation with the inverse of the reduction vector for the first iteration and the destination, which is the source vector for the vector population count determination, as illustrated in line 451-5.*b*.1 in FIG. 4 as "0x55055055". Reference number 5.*c*.3 of the example above (e.g., "Load Comp_Comp in Destination") corresponds to loading the result of the AND operation from the inverse of the reduction vector for the first iteration and the destination to Destination 439, as illustrated in line 451-5.*c*.3 of FIG. 4 as "0x55055055". This vector "0x55055055" in Destination 439 of line 451.*c*.3 is the second portion of the pattern mask for the first iteration.

Reference number 5.*d* of the example above (e.g., Perform a Half Add operation with the First Portion and the Second Portion of the Pattern") corresponds to creating the destination output for first iteration of the determination phase. Reference numbers 5.*d*.1-5.*d*.6 correspond to the calculation of the destination for the first iteration. The destination of the first iteration is used during subsequent steps in the second iteration.

Reference number 5.*d*.1 of the example above (e.g., "Perform a Half Add operation with Temp_Lookup and Destination") corresponds to performing a Half Add operation of the first and second portions of the pattern mask for the first iteration. Temp_Lookup stores the first portion of the pattern mask, as described above in association with reference number 5.*b*.3, and Destination stores the second portion of the pattern mask, as described above in association with reference number 5.*c*.3. A half add operation is an operation with two result vectors, a sum vector and a carry vector. In a half add operation, an input of 0 from both vectors results in a sum of 0 and a carry of 0, an input of 1 from one vector and a 0 from another vector results in a sum of 1 and a carry of 0, and an input of 1 from both vectors results in a sum of 0 and a carry of 1. The results of the half add operation are illustrated in line 451-5.*d*.1 in FIG. 4 as "0x10010000" in Comp_Comp 431 and as "0x45045055" in Destination 439, where the sum portion of the half add operation is stored in Destination 439 and the carry portion of the half add operation is stored in Comp_Comp 431. Reference number 5.*d*.2 of the example above (e.g., "Shift Comp_Comp Left by 1") corresponds to shifting the carry of the half add operation described above to the left by 1, as illustrated in line 451-5.*d*.2 in FIG. 4 as "0x20020000". Reference number 5.*d*.3 of the example above (e.g., "Check for Carry Values in Comp_Comp") corresponds to checking for any carry values that remain in the Comp_Comp 431 after the first half add and shift is performed. A BlockOR operation may be performed to check if carry values remain in the Comp_Comp 431. In this example, the BlockOR operation is determining whether a data value of "1" is stored in at least one compute component. If there are carry values remaining in the Comp_Comp 431, as indicated by the BlockOR operation, then a number of half add and shift operations are performed until carry values are no longer remaining in the Comp_Comp 431. In the example illustrated in FIG. 4, since there are carry values in the Comp_Comp 431 after the first half add and shift operation, another half add and shift operation is performed, as indicated by reference number 5.*d*.4 of the example above (e.g., Perform a Half Add operation with Comp_Comp and Destination") and illustrated in line 451-5.*d*.4 of FIG. 4 as "0x0" in the Comp_Comp 431 and "0x65065055" in Destination 439. The sum portion of the half add operation is in Destination 439 and the carry portion of the half add operation is in Comp_Comp 431. Reference number 5.*d*.5 of the example above (e.g., "Shift Comp_Comp Left by 1") corresponds to shifting the carry of the half add operation described above to the left by 1, as illustrated in line 451-5.*d*.5 in FIG. 4 as "0x0". Reference number 5.*d*.6 of the example above (e.g., "Check for Carry Values in Comp_Comp") corresponds to checking for any carry values that remain in the Comp_Comp 431 after the second half add and shift is performed. A BlockOR operation may be performed to check if carry values remain in the Comp_Comp 431. In the example illustrated in FIG. 4, there are no carry values in the Comp_Comp 431 after the second half add and shift operation, as determined by a BlockOR operation. Therefore, the first iteration is complete and the output of the first iteration is "0x65065055" stored in Destination 439 shown in line 451-5.*d*.6 of FIG. 4.

Reference number 6 of the example above (e.g., "Perform Second Iteration") corresponds to the second iteration of the determination phase. The second iteration compares the first four bits of each element when executing the example above to determine the vector population count. At reference number 6.*a* (e.g., "Obtain Reduction"), a reduction vector for the second iteration is obtained. Reference numbers 6.*a*.1-6.*a*.9 correspond to the calculation of the reduction vector for the second iteration. The reduction vector is used during subsequent steps of the second iteration.

Reference number 6.*a*.1 of the example above (e.g., "Load Elem_Mask in Reduction") corresponds to loading Reduction 435 with the element mask, as illustrated line 451-6.*a*.1 in FIG. 4 as "0x80808080". Reference number 6.*a*.2 of the example above (e.g., "Load Elem_Mask in Comp_Comp") corresponds to loading Comp_Comp 431 with the element mask, as illustrated line 451-6.*a*.2 in FIG. 4 as "0x80808080". Each iteration includes calculating the shift for the iteration, which corresponds to $2^{I-1}$. In the second iteration, the shift is 2, which corresponds to the first four bits of each element are being compared. In the second iteration, a first loop of shifting the vector in the Comp_Comp 431 by 1 and performing an OR operation with the vector in the Reduction 435 is performed once because c=2 and is equal to the shift of 2. The second loop of shifting the vector in the Comp_Comp includes shifting the Comp_Comp 431 by 2*I, which is 2*2=4 for the second iteration, and performing an OR operation with the vector in Temp_Lookup 433. Each iteration includes determining the reduction vector width, which is 2', and the efficient ration, which is the element size divided by the reduction vector width. In the second iteration, the reduction vector width is 22=4 and the efficient ratio is 8/4=2. Each iteration includes performing the second loop from c to the efficient ratio. In the second iteration, the second loop is performed 1 time as c=1 and the efficient ratio is 1. The first loop of the second iteration corresponds to reference numbers 6.a.3-6.a.5 and the second loop of the second iteration corresponds to reference numbers 6.a.6-6.a.9.

Reference number 6.a.3 of the example above (e.g., "Shift Comp_Comp Right by 1") corresponds to shifting the element mask in Comp_Comp 431 to the right by 1, as illustrated line 451-6.a.3 in FIG. 4 as "0x40404040". Reference number 6.a.4 of the example above (e.g., "Perform OR Operation with Comp_Comp and Reduction") corresponds to adding the shifted vector in Comp_Comp 431 and the vector in Reduction 439, as illustrated line 451-6.a.4 in FIG. 4 as "0xC0C0C0C0". Reference number 6.a.5 of the example above (e.g., "Load Comp_Comp in Temp_Lookup") corresponds to loading the result of the OR operation described above in Temp_Lookup 433, as illustrated in line 451-6.a.5 of FIG. 4 as "0xC0C0C0C0". Reference number 6.a.6 of the example above (e.g., "Shift Comp_Comp Right by 4") corresponds shifting the result of the first loop by 4 places, as illustrated line 451-6.a.6 in FIG. 4 as "0x0C0C0C0C". Reference number 6.a.7 of the example above (e.g., "Perform OR Operation with Comp_Comp and Temp_Lookup") corresponds to performing an OR operation with the shifted vector stored in Comp_Comp 431 and the result of the first loop stored in Temp_Lookup 433, as illustrated line 451-6.a.7 in FIG. 4 as "0xCCCCCCCC". Reference number 6.a.8 of the example above (e.g., "Load Comp_Comp in Temp_Lookup") corresponds to loading the result of the OR operation of the vectors in Comp_Comp 431 and Temp_Lookup 433 discussed above in Temp_Lookup 433, as illustrated line 451-6.a.8 in FIG. 4 as "0xCCCCCCCC". Reference number 6.a.9 of the example above (e.g., "Load Comp_Comp in Reduction") corresponds to loading the result of the OR operation of the vectors in Comp_Comp 431 and Temp_Lookup 433 discussed above in Reduction 435, as illustrated line 451-6.a.9 in FIG. 4 as "0xCCCCCCCC", which is the reduction vector for the second iteration.

Reference number 6.b of the example above (e.g., Obtain First Portion of Pattern") corresponds to creating the pattern mask for second iteration of the determination phase. Reference numbers 6.b.1-6.b.3 correspond to the calculation of the first portion of the pattern mask for the second iteration. The first portion of the pattern mask is used during subsequent steps of the second iteration.

Reference number 6.b.1 of the example above (e.g., "Perform AND Operation with Comp_Comp and Destination") corresponds to performing an AND operation with the reduction vector for the second iteration and the destination, which is the result of the first iteration, as illustrated in line 451-6.b.1 in FIG. 4 as "0x44044044". Reference number 6.b.2 of the example above (e.g., "Shift Comp_Comp Right by 2") corresponds to shifting the result of the AND operation with the reduction vector and the result of the first iteration that is stored in Comp_Comp 431 to the right two places, as illustrated line 451-6.b.2 in FIG. 4 as "0x11011011". When generating the pattern mask, the vector in the Comp_Comp 431 that resulted from performing an AND operation with the reduction vector and the destination is shifted $2^{I-1}$ places. In the example of FIG. 4, the vector in the Comp_Comp 431 is shifted right 2 places during the second iteration. Reference number 6.b.3 of the example above (e.g., "Load Comp_Comp in Temp_Lookup") corresponds to loading the shifted vector from Comp_Comp 431 to Temp_Lookup 433, as illustrated in line 451-6.b.3 of FIG. 4 as "0x11011011". This vector "0x11011011" in Temp_Lookup 433 of line 451.6.b.3 is the first portion of the pattern mask for the second iteration.

Reference number 6.c of the example above (e.g., Obtain Second Portion of Pattern") corresponds to creating the pattern mask for second iteration of the determination phase. Reference numbers 6.c.1-6.c.3 correspond to the calculation of the second portion of the pattern mask for the second iteration. The second portion of the pattern mask is used during subsequent steps of the second iteration.

Reference number 6.c.1 of the example above (e.g., "Load Inverse of Reduction in Comp_Comp") corresponds to loading the inverse of the reduction vector in Comp_Comp 431, as illustrated in line 451-6.b.1 in FIG. 4 as "0x33333333". Reference number 6.c.2 of the example above (e.g., "Perform AND Operation with Comp_Comp and Destination") corresponds to performing an AND operation with the inverse of the second iteration's reduction vector and the destination, which is the result of the first iteration, as illustrated in line 451-6.c.2 in FIG. 4 as "0x21021011". Reference number 6.c.3 of the example above (e.g., "Load Comp_Comp in Destination") corresponds to loading the result of the AND operation from the inverse of the second iteration's reduction vector and the destination to Destination 439, as illustrated in line 451-6.c.3 of FIG. 4 as "0x21,02,10,11". This vector "0x21021011" in Destination 439 of line 451.c.3 is the second portion of the pattern mask for the second iteration.

Reference number 6.d of the example above (e.g., Perform a Half Add operation with the First Portion and the Second Portion of the Pattern") corresponds to creating the destination output for second iteration of the determination phase. Reference numbers 6.d.1-6.d.6 correspond to the calculation of the output for the first iteration. The output of the first iteration, stored in Destination 439, is used during subsequent steps in the third iteration.

Reference number 6.d.1 of the example above (e.g., "Perform a Half Add operation with Temp_Lookup and Destination") corresponds performing a Half Add operation of the first and second portions of the pattern mask of the second iteration. Temp_Lookup stores the first portion of the pattern mask, as described above in association with reference number 6.b.3, and Destination stores the second portion of the pattern mask, as described above in association with reference number 6.c.3. The results of the half add operation are illustrated in line 451-6.d.1 in FIG. 4 as "0x01001011" in Comp_Comp 431 and as "0x30030000" in Destination 439, where the sum portion of the half add operation is stored in Destination 439 and the carry portion of the half add operation is stored in Comp_Comp 431. Reference number 6.d.2 of the example above (e.g., "Shift Comp_Comp Left by 1") corresponds to shifting the carry of the half add operation described above to the left by 1, as illustrated in line 451-6.d.2 in FIG. 4 as "0x02002022". Reference number 6.d.3 of the example above (e.g., "Check for Carry Values in Comp_Comp") corresponds to checking for any carry values that remain in the Comp_Comp 431 after the first half add and shift is performed. A BlockOR operation may be performed to check if carry values remain in the Comp_Comp 431. If there are carry values remaining in the Comp_Comp 431, as indicated by the BlockOR operation, then a number of half add and shift operations are performed until carry values are no longer remaining in the Comp_Comp 431. In the example illustrated in FIG. 4, since there are carry values in the Comp_Comp 431 after the first half add and shift operation, another half add and shift operation is performed, as indicated by reference number 6.*d*.4 of the example above (e.g., Perform a Half Add operation with Comp_Comp and Destination") and illustrated in line 451-6.*d*.4 of FIG. 4 as "0x0" in the Comp_Comp 431 and "0x32032022" in Destination 439. The sum portion of the half add operation is in Destination 439 and the carry portion of the half add operation is in Comp_Comp 431. Reference number 6.*d*.5 of the example above (e.g., "Shift Comp_Comp Left by 1") corresponds to shifting the carry of the half add operation described above to the left by 1, as illustrated in line 451-6.*d*.5 in FIG. 4 as "0x0". Reference number 6.*d*.6 of the example above (e.g., "Check for Carry Values in Comp_Comp") corresponds to checking for any carry values that remain in the Comp_Comp 431 after the second half add and shift is performed. A BlockOR operation may be performed to check if carry values remain in the Comp_Comp 431. In the example illustrated in FIG. 4, there are no carry values in the Comp_Comp 431 after the second half add and shift operation, as determined by a BlockOR operation. Therefore, the second iteration is complete and the output of the second iteration is "0x32032022" stored in Destination 439 shown in line 451-6.*d*.6 of FIG. 4.

Reference number 7 of the example above (e.g., "Perform Third Iteration") corresponds to the third iteration of the determination phase. The third iteration compares the all eight bits of each element when executing the example above to determine the vector population count. At reference number 7.*a* (e.g., "Obtain Reduction"), a reduction vector for the third iteration is obtained. Reference numbers 7.*a*.1-7.*a*.10 correspond to the calculation of the reduction vector for the third iteration. The reduction vector is used during subsequent steps of the third iteration.

Reference number 7.*a*.1 of the example above (e.g., "Load Elem_Mask in Reduction") corresponds to loading Reduction 435 with the element mask, as illustrated line 451-7.*a*.1 in FIG. 4 as "0x80808080". Reference number 7.*a*.2 of the example above (e.g., "Load Elem_Mask in Comp_Comp") corresponds to loading Comp_Comp 431 with the element mask, as illustrated line 451-7.*a*.2 in FIG. 4 as "0x80808080". Each iteration includes calculating the shift for the iteration, which corresponds to $2^{I-1}$. In the third iteration, the shift is 4, which corresponds to all eight bits of each element are being compared. In the third iteration, a first loop of shifting the vector in the Comp_Comp 431 by 1 and performing an OR operation with the vector in the Reduction 435 is performed from c to the shift. In the third iteration, the first loop is performed three times because c=2 and the shift is 4. The second loop of shifting the vector in the Comp_Comp includes shifting the Comp_Comp 431 by 2*I, which is 2*3=6 for the third iteration, and performing an OR operation with the vector in Temp_Lookup 433. Each iteration includes determining the reduction vector width, which is $2^I$, and the efficient ration, which is the element size divided by the reduction vector width. In the third iteration, the reduction vector width is $2^3=8$ and the efficient ratio is 8/8=1. Each iteration includes performing the second loop from c to the efficient ratio-1. In the third iteration, the second loop is skipped as c=1 and the efficient ratio-1 is 0. The first loop of the third iteration corresponds to reference numbers 7.*a*.3-7.*a*.10.

Reference number 7.*a*.3 of the example above (e.g., "Shift Comp_Comp Right by 1") corresponds to shifting the element mask in Comp_Comp 431 to the right by 1, as illustrated line 451-7.*a*.3 in FIG. 4 as "0x40404040". Reference number 7.*a*.4 of the example above (e.g., "Perform OR Operation with Comp_Comp and Reduction") corresponds to an OR operation of the shifted vector in Comp_Comp 431 and the bit-vector in Reduction 439, as illustrated line 451-7.*a*.4 in FIG. 4 as "0xC0C0C0C0". Reference number 7.*a*.5 of the example above (e.g., "Shift Comp_Comp Right by 1") corresponds to shifting the result of the OR operation of the shifted vector in Comp_Comp 431 and the bit-vector in Reduction 439, as illustrated line 451-7.*a*.5 in FIG. 4 as "0x60606060". Reference number 7.*a*.6 of the example above (e.g., "Perform OR Operation with Comp_Comp and Reduction") corresponds to an OR operation of the shifted vector in Comp_Comp 431 and the bit-vector in Reduction 439, as illustrated line 451-7.*a*.6 in FIG. 4 as "0xE0E0E0E0". Reference number 7.*a*.7 of the example above e.g., "Shift Comp_Comp Right by 1") corresponds to shifting the result of the OR operation of the shifted vector in Comp_Comp 431 and the bit-vector in Reduction 439, as illustrated line 451-7.*a*.7 in FIG. 4 as "0x70707070". Reference number 7.*a*.8 of the example above (e.g., "Perform OR Operation with Comp_Comp and Reduction") corresponds to an OR operation of the shifted vector in Comp_Comp 431 and the vector in Reduction 439, as illustrated line 451-7.*a*.6 in FIG. 4 as "0xF0F0F0F0". Reference number 7.*a*.9 of the example above (e.g., "Load Comp_Comp in Temp_Lookup") corresponds to loading the result of the OR operation discussed above in Temp_Lookup 433, as illustrated line 451-7.*a*.9 in FIG. 4 as "0xF0F0F0F0" Reference number 7.*a*.10 of the example above (e.g., "Load Comp_Comp in Reduction") corresponds to loading the result of the OR operation discussed above in Reduction 435, as illustrated line 451-7.*a*.10 in FIG. 4 as "0xF0F0F0F0", which is the reduction vector for the third iteration.

Reference number 7.*b* of the example above (e.g., Obtain First Portion of Pattern") corresponds to creating the pattern mask for third iteration of the determination phase. Reference numbers 7.*b*.1-7.*b*.3 correspond to the calculation of the first portion of the pattern mask for the third iteration. The first portion of the pattern mask is used during subsequent steps of the third iteration.

Reference number 7.*b*.1 of the example above (e.g., "Perform AND Operation with Comp_Comp and Destination") corresponds to performing an AND operation with the reduction vector for the third iteration and the destination, which is the result of the second iteration, as illustrated in line 451-7.*b*.1 in FIG. 4 as "00x30002020". Reference number 7.*b*.2 of the example above (e.g., "Shift Comp_Comp Right by 2") corresponds to shifting the result of the AND operation with the reduction vector and the result of the second iteration that is stored in Comp_Comp 431 to the right four places, as illustrated line 451-7.*b*.2 in FIG. 4 as "0x03000202". When generating the pattern mask, the vector in the Comp_Comp 431 that resulted from performing an AND operation with the reduction vector and the destination is shifted $2^{I-1}$ places. In the example of FIG. 4, the vector in the Comp_Comp 431 is shifted right 4 places during the third iteration. Reference number 7.*b*.3 of the example above (e.g., "Load Comp_Comp in Temp_Lookup") corresponds to loading the shifted vector from Comp_Comp 431 to Temp_Lookup 433, as illustrated in line 451-7.*b*.3 of FIG. 4 as "0x03000202". This vector "0x03000202" in Temp_Lookup 433 of line 451.*b*.3 is the first portion of the pattern mask for the third iteration.

Reference number 7.*c* of the example above (e.g., Obtain Second Portion of Pattern") corresponds to creating the pattern mask for third iteration of the determination phase. Reference numbers 7.*c*.1-7.*c*.3 correspond to the calculation of the second portion of the pattern mask for the third iteration. The second portion of the pattern mask is used during subsequent steps of the third iteration.

Reference number 7.*c*.1 of the example above (e.g., "Load Inverse of Reduction in Comp_Comp") corresponds to loading the inverse of the reduction vector in Comp_Comp 431, as illustrated in line 451-7.*c*.1 in FIG. 4 as "0x0F0F0F0F". Reference number 7.*c*.2 of the example above (e.g., "Perform AND Operation with Comp_Comp and Destination") corresponds to performing an AND operation with the inverse of the third iteration's reduction vector and the destination, which is the result of the second iteration, as illustrated in line 451-7.*c*.2 in FIG. 4 as "0x02030002". Reference number 7.*c*.3 of the example above (e.g., "Load Comp_Comp in Destination") corresponds to loading the result of the AND operation from the inverse of the third iteration's reduction vector and the destination to Destination 439, as illustrated in line 451-7.*c*.3 of FIG. 4 as "0x02030002". This vector "0x02030002" in Destination 439 of line 451.*c*.3 is the second portion of the pattern mask for the third iteration.

Reference number 7.*d* of the example above (e.g., Perform a Half Add operation with the First Portion and the Second Portion of the Pattern") corresponds to creating the destination output for second iteration of the determination phase. Reference numbers 7.*d*.1-7.*d*.6 correspond to the calculation of the output for the first iteration. The output of the first iteration, stored in Destination 439, is used during subsequent steps in the third iteration.

Reference number 7.*d*.1 of the example above (e.g., "Perform a Half Add operation with Temp_Lookup and Destination") corresponds to performing a Half Add operation of the first and second portions of the pattern mask of the third iteration. Temp_Lookup stores the first portion of the pattern mask, as described above in association with reference number 7.*b*.3, and Destination stores the second portion of the pattern mask, as described above in association with reference number 7.*c*.3. The results of the half add operation are illustrated in line 451-7.*d*.1 in FIG. 4 as "0x02000002" in Comp_Comp 431 and as "0x01030200" in Destination 439, where the sum portion of the half add operation is stored in Destination 439 and the carry portion of the half add operation is stored in Comp_Comp 431 Reference number 7.*d*.2 of the example above (e.g., "Shift Comp_Comp Left by 1") corresponds to shifting the carry of the half add operation described above to the left by 1, as illustrated in line 451-7.*d*.2 in FIG. 4 as "0x04000004". Reference number 7.*d*.3 of the example above (e.g., "Check for Carry Values in Comp_Comp") corresponds to checking for any carry values that remain in the Comp_Comp 431 after the first half add and shift is performed. A BlockOR operation may be performed to check if carry values remain in the Comp_Comp 431. If there are carry values remaining in the Comp_Comp 431, as indicated by the BlockOR operation, then a number of half add and shift operations are performed until carry values are no longer remaining in the Comp_Comp 431. In the example illustrated in FIG. 4, since there are carry values in the Comp_Comp 431 after the first half add and shift operation, another half add and shift operation is performed, as indicated by reference number 7.*d*.4 of the example above (e.g., Perform a Half Add operation with Comp_Comp and Destination") and illustrated in line 451-7.*d*.4 of FIG. 4 as "0x0" in the Comp_Comp 431 and "0x05030204" in Destination 439. The sum portion of the half add operation is in Destination 439 and the carry portion of the half add operation is in Comp_Comp 431. Reference number 7.*d*.5 of the example above (e.g., "Shift Comp_Comp Left by 1") corresponds to shifting the carry of the half add operation described above to the left by 1, as illustrated in line 451-7.*d*.5 in FIG. 4 as "0x0". Reference number 7.*d*.6 of the example above (e.g., "Check for Carry Values in Comp_Comp") corresponds to checking for any carry values that remain in the Comp_Comp 431 after the second half add and shift is performed. A BlockOR operation may be performed to check if carry values remain in the Comp_Comp 431. In the example illustrated in FIG. 4, there are no carry values in the Comp_Comp 431 after the second half add and shift operation, as determined by a BlockOR operation. Therefore, the third iteration is complete and the output of the third iteration is "0x05030204" stored in Destination 439 shown in line 451-7.*d*.6 of FIG. 4, which is the vector population count for the source vector in the example illustrated in FIG. 4.

Figure 5A:
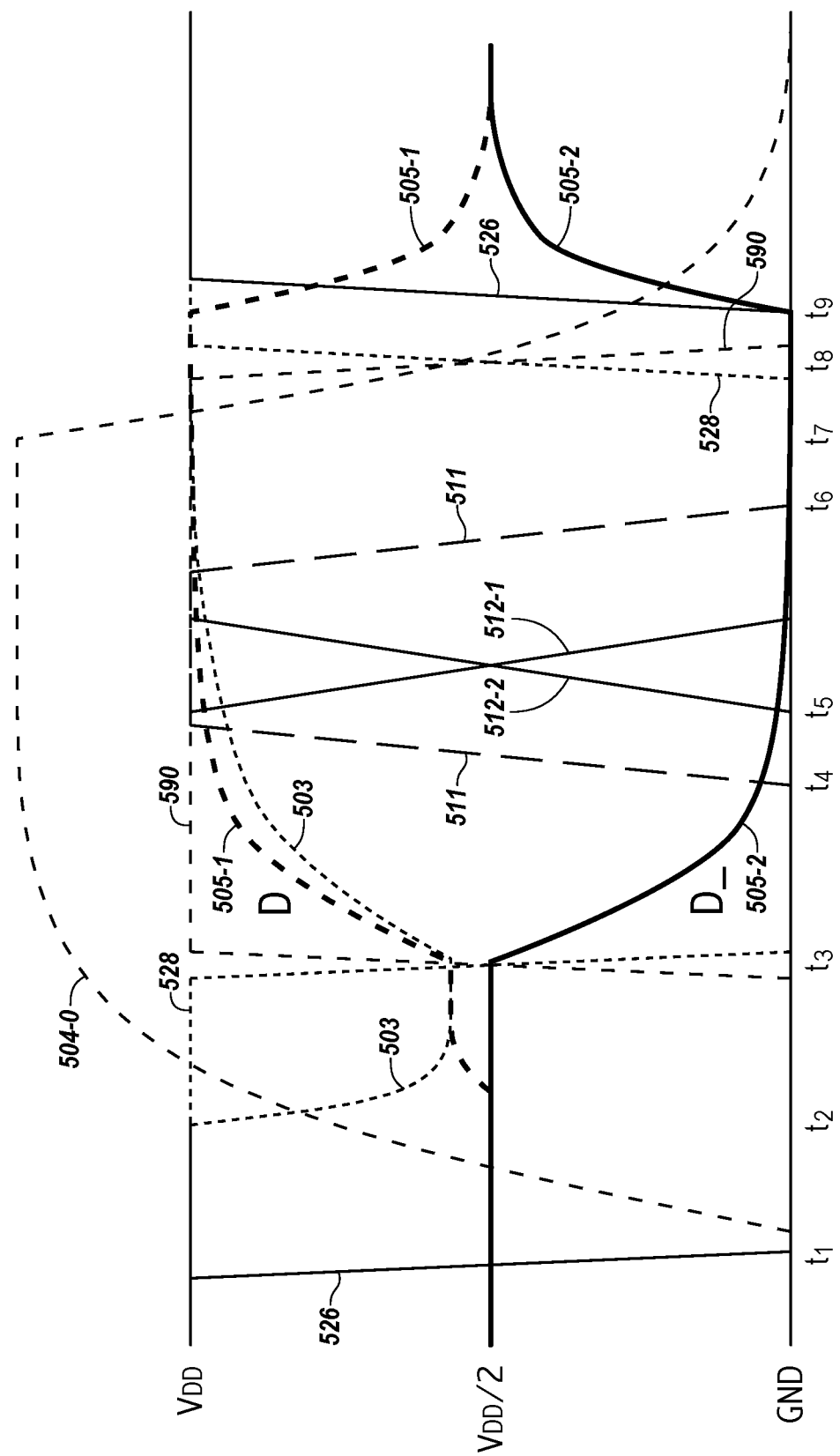
FIGS. 5A-5D illustrate timing diagrams associated with performing a number of logical operations using sensing circuitry in accordance with a number of embodiments of the present disclosure.

FIG. 5A illustrates a timing diagram associated with performing a number of logical operations using sensing circuitry in accordance with a number of embodiments of the present disclosure. The functionality of the sensing circuitry 250 of FIG. 2A is described below with respect to performing logical operations and initially storing a result in the compute component 231 (e.g., secondary latch of the Comp_Compulator). The timing diagram shown in FIG. 5A illustrates signals (e.g., voltage signals) associated with performing a first operation phase of a logical operation (e.g., an R-input logical operation) using the sensing circuitry illustrated in FIG. 2A. The first operation phase described with respect to FIG. 5A can be a first operation phase of an AND, NAND, OR, or NOR operation, for instance. Performing the operation phase illustrated in FIG. 5A can involve consuming significantly less energy (e.g., about half) than previous processing approaches that may involve providing a full swing between voltage rails (e.g., between a supply and ground).

In the example illustrated in FIG. 5*a*, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the Comp_Compulator. The time references (e.g., $t_1$, etc.) shown in FIG. 5A do not necessarily represent a same absolute or relative time as similar time references in other timing diagrams.

At time $t_1$, the equilibration signal 526 is deactivated, and then a selected row is enabled (e.g., the row corresponding to a memory cell whose data value is to be sensed and used as a first input). Signal 504-0 represents the voltage signal applied to the selected row (e.g., Row Y 204-Y shown in FIG. 2A). When row signal 504-0 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 shown in FIG. 2A if the cell is a 1T1C DRAM cell), which creates a differential voltage signal between the data lines D and D_ (e.g., as indicated by signals 505-1 and 505-2 on the data lines, respectively) between times $t_2$ and $t_3$. The voltage of the selected cell is represented by signal 503. Due to conservation of energy, creating the differential signal between data lines D and D_ (e.g., by coupling the cell to data line D) does not consume energy, since the energy associated with enabling/disabling the row signal 504-0 can be amortized over the plurality of memory cells coupled to the row.

At time $t_3$, the sense amplifier (e.g., 206 shown in FIG. 2A) is enabled (e.g., a positive control signal 590 (e.g., corresponding to ACT 290 shown in FIG. 2B) goes high and the negative control signal 528 (e.g., corresponding to RnIF 228 shown in FIG. 2B) goes low), which amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line DJ, such that the sensed data value is stored in the primary latch of sense amplifier 206. The primary energy consumption occurs in charging the data line D (205-1) from the equilibration voltage $V_{DD}/2$ to the rail voltage $V_{DD}$. FIG. 5A shows, in example, the data line voltages 505-1 and 505-2 that correspond to a logic "1" being on data line D.

According to some embodiments, the primary latch of sense amplifier 206 can be coupled to the complementary data lines D and D_ through respective pass transistors (not shown in FIG. 2A but in a similar configuration as the manner in which latch 264 is coupled to the data lines D and D_ through load/pass transistors 218-1 and 218-2 shown in FIG. 2A). The Passd control signal 511 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 511 applied to control lines coupled to the respective gates of the pass transistors going high). At time $t_5$, the Comp_Compulator positive control signal 512-1 (e.g., Comp_Compb) and the Comp_Compulator positive control signal 512-2 (e.g., Comp_Comp) are activated via respective control lines 212-1 and 212-2 shown in FIG. 2A. As described below, the Comp_Compulator control signals COMP_COMPB 1412-1 and COMP_COMP 512-2 may remain activated for subsequent operation phases. As such, in this example, activating the control signals COMP_COMPB 512-1 and COMP_COMP 512-2 enables the secondary latch (e.g., Comp_Compulator) of compute component 231 shown in FIG. 2A. The sensed data value stored in sense amplifier 206 is transferred (e.g., copied) to the secondary latch, including the dynamic latch and latch 264.

At time $t_6$, the Passd control signal 511 (and the Passdb control signal) goes low thereby turning off the pass transistors (if present). However, since the Comp_Compulator control signals COMP_COMPB 512-1 and COMP_COMP 512-2 remain activated, an Comp_Compulated result is stored (e.g., latched) in the secondary latches (e.g., Comp_Compulator). At time $t_7$, the row signal 504-0 is deactivated, and the array sense amps are disabled at time is (e.g., sense amplifier control signals 528 and 590 are deactivated).

At time $t_9$, the data lines D and D_ are equilibrated (e.g., equilibration signal 526 is activated), as illustrated by data line voltage signals 505-1 and 505-2 moving from their respective rail values to the equilibration voltage ($V_{DD}/2$). The equilibration consumes little energy due to the law of conservation of energy. As described above in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 5B:
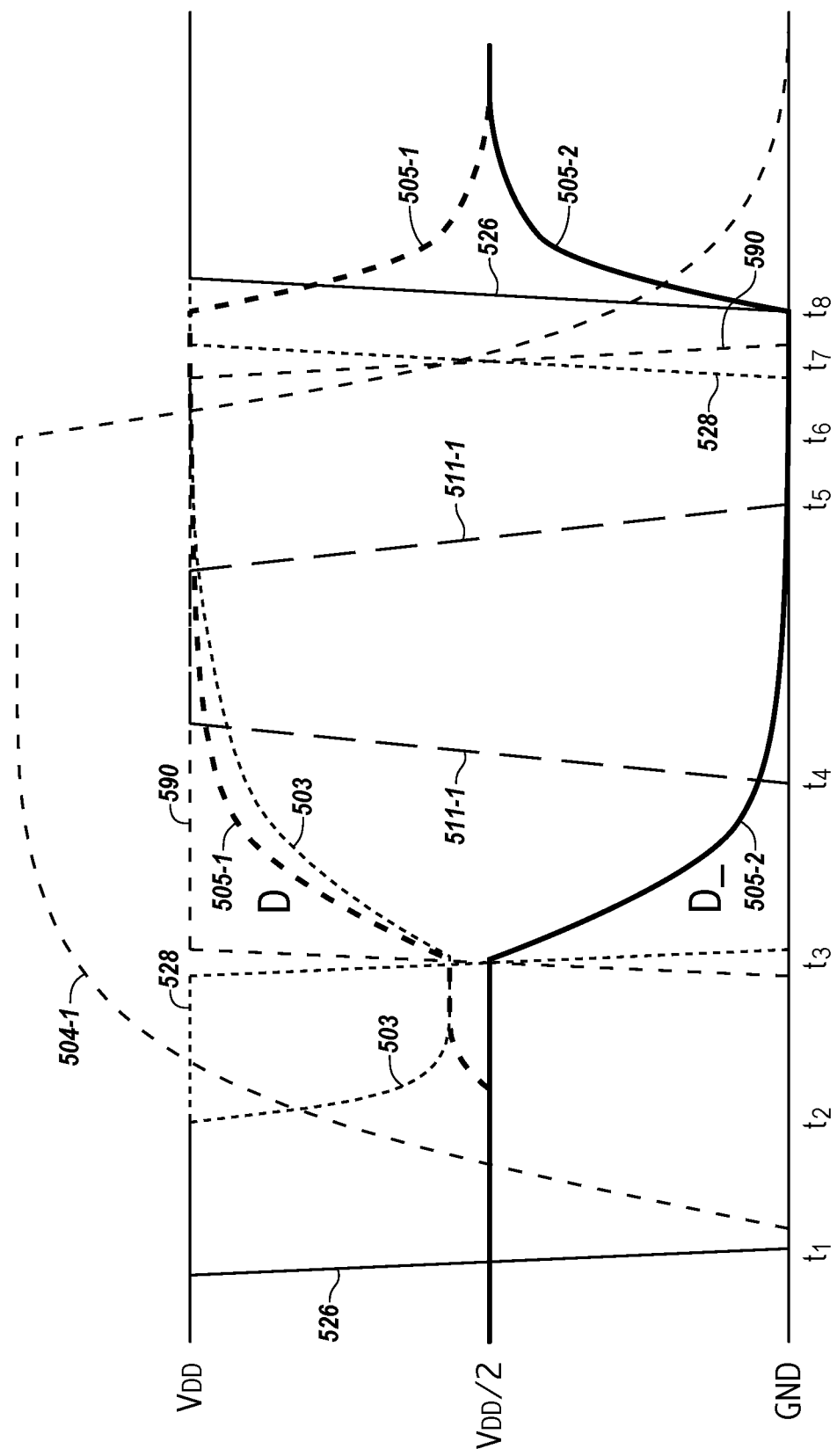
Figure 5C:
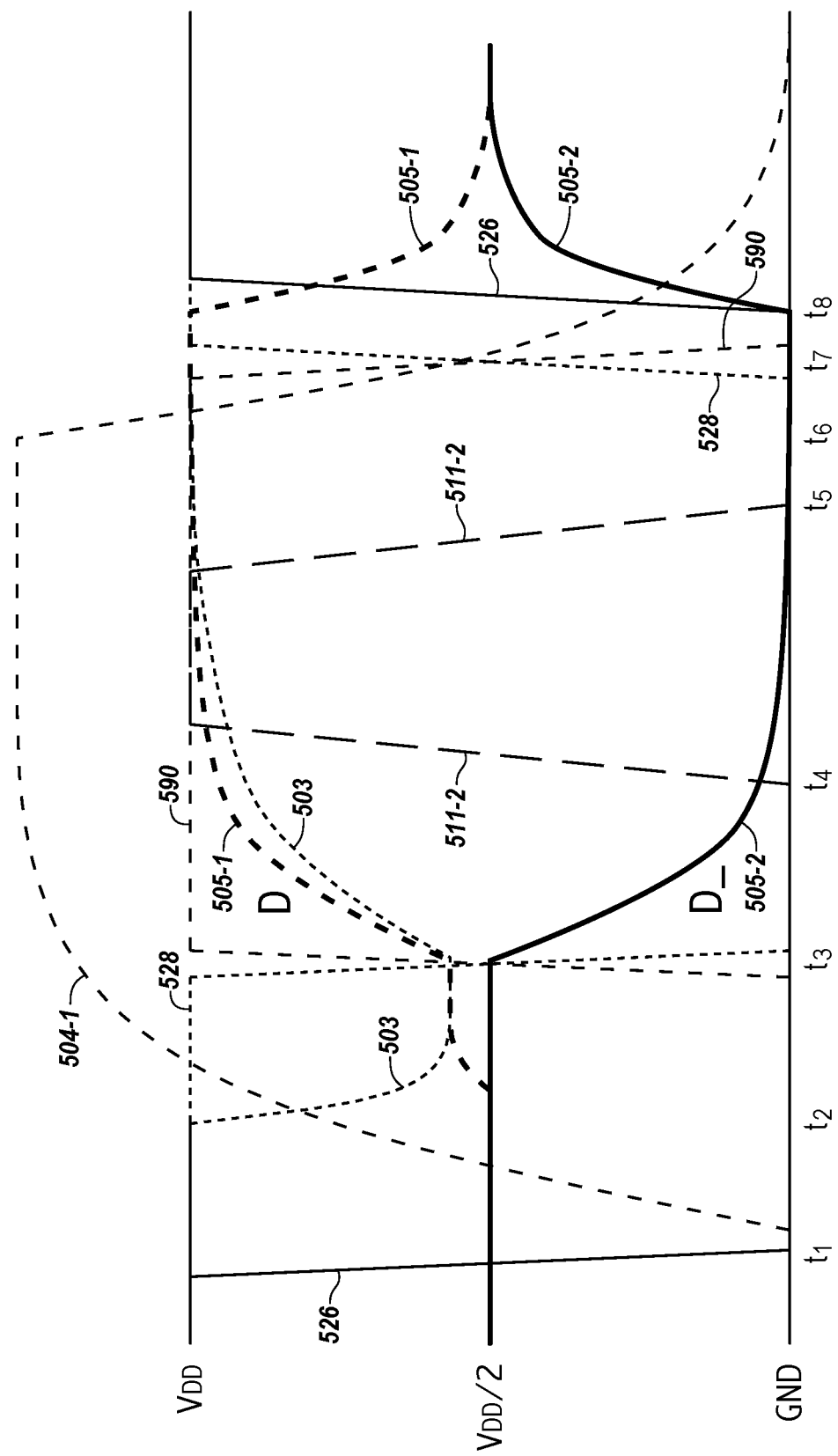

FIGS. 5B and 5C respectively illustrate timing diagrams associated with performing a number of logical operations using sensing circuitry in accordance with a number of embodiments of the present disclosure. Timing diagrams shown in FIGS. 5B and 5C illustrate signals (e.g., voltage signals) associated with performing a number of intermediate operation phases of a logical operation (e.g., an R-input logical operation). For instance, timing diagram shown in FIG. 5B corresponds to a number of intermediate operation phases of an R-input NAND operation or an R-input AND operation, and timing diagram shown in FIG. 5C corresponds to a number of intermediate operation phases of an R-input NOR operation or an R-input OR operation. For example, performing an AND or NAND operation can include performing the operation phase shown in FIG. 5B one or more times subsequent to an initial operation phase such as that described with respect to FIG. 5A. Similarly, performing an OR or NOR operation can include performing the operation phase shown and described with respect to Figure one or more times subsequent to an initial operation phase such as that described with respect to FIG. 5A.

As shown in the timing diagrams illustrated in FIGS. 5B and 5C, at time $t_1$, equilibration is disabled (e.g., the equilibration signal 526 is deactivated), and then a selected row is enabled (e.g., the row corresponding to a memory cell whose data value is to be sensed and used as an input such as a second input, third input, etc.). Signal 504-1 represents the voltage signal applied to the selected row (e.g., Row Y 204-Y shown in FIG. 2A). When row signal 504-1 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 if the cell is a 1T1C DRAM cell), which creates a differential voltage signal between the data lines D and D_ (e.g., as indicated by signals 505-1 and 505-2, respectively) between times $t_2$ and $t_3$. The voltage of the selected cell is represented by signal 503. Due to conservation of energy, creating the differential signal between D and D_ (e.g., by coupling the cell to data line D) does not consume energy, since the energy associated with activating/deactivating the row signal 504-1 can be amortized over the plurality of memory cells coupled to the row.

At time $t_3$, the sense amplifier (e.g., 206 shown in FIG. 2A) is enabled (e.g., a positive control signal 590 (e.g., corresponding to ACT 233 shown in FIG. 2B) goes high, and the negative control signal 528 (e.g., RnIF 228 shown in FIG. 2B) goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line DJ, such that the sensed data value is stored in the primary latch of sense amplifier 206. The primary energy consumption occurs in charging the data line D (205-1) from the equilibration voltage $V_{DD}/2$ to the rail voltage $V_{DD}$.

As shown in timing diagrams illustrated in FIGS. 5B and 5C, at time $t_4$ (e.g., after the selected cell is sensed), only one of control signals 511-1 (Passd) shown in FIG. 5B and 511-2 (Passdb) shown in FIG. 5C is activated (e.g., only one of pass transistors (if present) is enabled), depending on the particular logic operation. For example, since the timing diagram illustrated in FIG. 5B corresponds to an intermediate phase of a NAND or AND operation, control signal 511-1 (Passd) is activated at time $t_4$ to turn on the pass transistor coupling the primary latch to data line D and the Passdb control signal remains deactivated leaving the pass transistor coupling the primary latch to data line D_ turned off. Conversely, since the timing diagram illustrated in FIG. 5C corresponds to an intermediate phase of a NOR or OR operation, control signal 511-2 (Passdb) is activated at time $t_4$ to turn on the pass transistor coupling the primary latch to data line D_ and control signal Passd remains deactivated leaving the pass transistor coupling the primary latch to data line D turned off. Recall from above that the Comp_Compulator control signals 512-1 (Comp_Compb) and 512-2 (Comp_Comp) were activated during the initial operation phase described with respect to FIG. 5A, and they remain activated during the intermediate operation phase(s).

Since the Comp_Computator was previously enabled, activating only Passd (511-1 as shown in FIG. 5B) results in Comp_Computing the data value corresponding to the voltage signal 505-1 shown in FIG. 5B corresponding to data line D. Similarly, activating only Passdb (511-2 as shown in FIG. 5C) results in Comp_Computing the data value corresponding to the voltage signal 505-2 corresponding to data line D_. For instance, in an example AND/NAND operation shown in the timing diagram illustrated in FIG. 5B in which only Passd (511-1) is activated, if the data value stored in the second selected memory cell is a logic "0," then the Comp_Computed value associated with the secondary latch is asserted low such that the secondary latch stores logic "0." If the data value stored in the second selected memory cell is not a logic "0," then the secondary latch retains its stored first selected memory cell data value (e.g., a logic "1" or a logic "0"). As such, in this AND/NAND operation example, the secondary latch is serving as a zeroes (0s) Comp_Compulator.

Similarly, in an example OR/NOR operation shown in the timing diagram illustrated in FIG. 5C in which only Passdb 511-2 is activated, if the data value stored in the second selected memory cell is a logic "1," then the Comp_Compulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) Comp_Compulator since voltage signal 505-2 on D_ is setting the true data value of the Comp_Compulator.

At the conclusion of an intermediate operation phase such as that shown in FIG. 5B or 5C, the Passd signal 511-1 (e.g., for AND/NAND) or the Passdb signal 511-2 (e.g., for OR/NOR) is deactivated (e.g., at time $t_5$), the selected row is disabled (e.g., at time $t_6$), the sense amplifier is disabled (e.g., at time $t_7$), and equilibration occurs (e.g., at time $t_8$). An intermediate operation phase such as that illustrated in FIG. 5B or 5C can be repeated in order to Comp_Compulate results from a number of additional rows. As an example, the sequence of timing diagram illustrated in FIG. 5B and/or 5C can be performed a subsequent (e.g., second) time for a third memory cell, a subsequent (e.g., third) time for a fourth memory cell, etc. For instance, for a 10-input NOR operation, the intermediate phase shown in FIG. 5C can occur 9 times to provide 9 inputs of the 10-input logical operation, with the tenth input being determined during the initial operation phase (e.g., as described with respect to FIG. 5A).

Figure 5D:
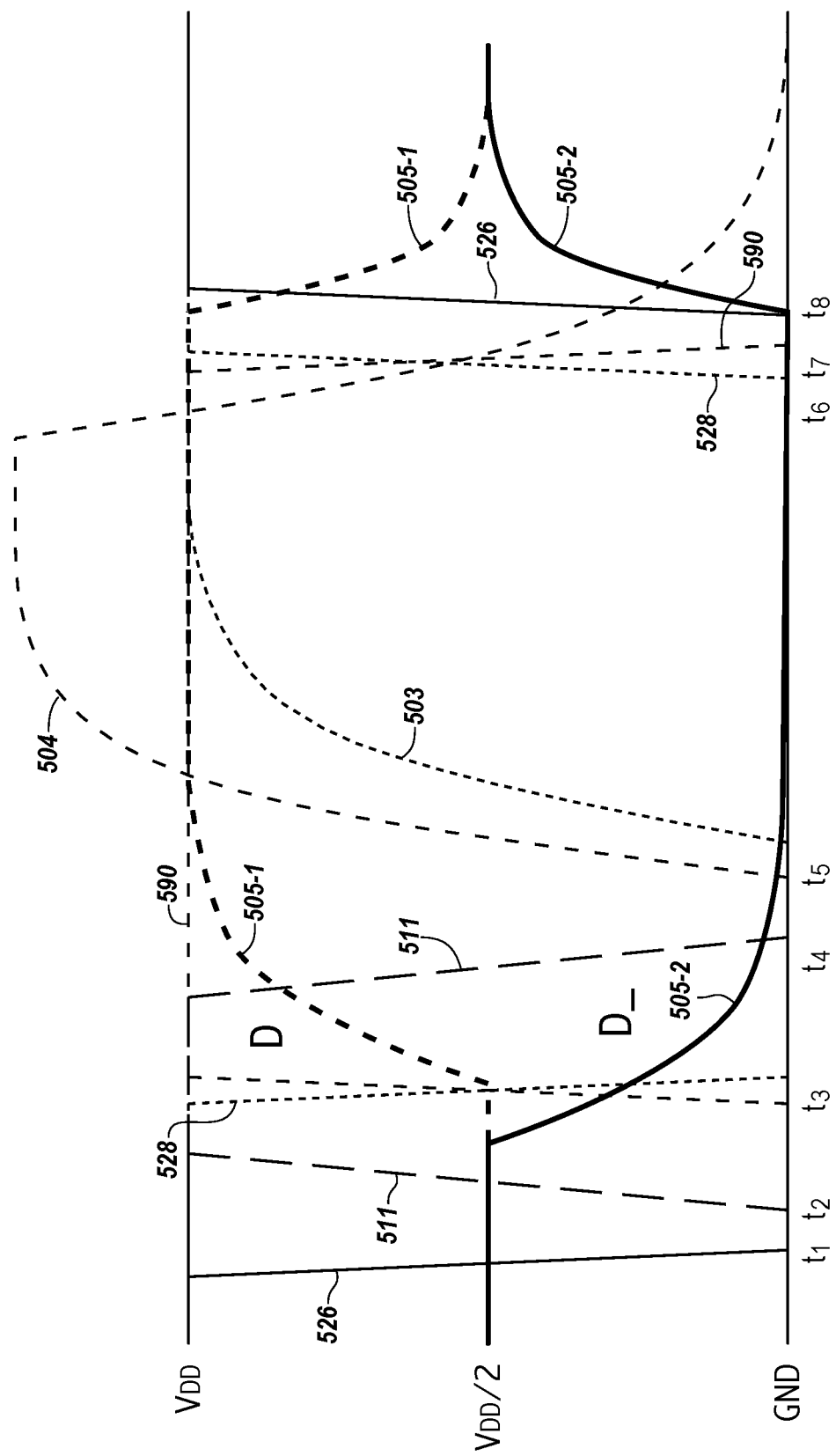

FIG. 5D illustrates a timing diagram associated with performing a number of logical operations using sensing circuitry in accordance with a number of embodiments of the present disclosure. The timing diagram illustrated in FIG. 5D shows signals (e.g., voltage signals) associated with performing a last operation phase of a logical operation (e.g., an R-input logical operation). For instance, the timing diagram illustrated in FIG. 5D corresponds to a last operation phase of an R-input AND operation or an R-input OR operation.

For example, performing a last operation phase of an R-input can include performing the operation phase shown in FIG. 5D subsequent to a number of iterations of the intermediate operation phase(s) described in association with FIGS. 5B and/or 5C. Table 3 shown below indicates the Figures corresponding to the sequence of operation phases associated with performing a number of R-input logical operations in accordance with a number of embodiments described herein.

TABLE 3

| Operation | FIG. 5A | FIG. 5B | FIG. 5C | FIG. 5D |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R-1 iterations for an AND operation in the sense amplifier, then inverting the sense amplifier before conducting the last operation phase to store the result (described below). A NOR operation can be implemented, for example, by storing the result of the R-1 iterations for an OR operation in the sense amplifier, then inverting the sense amplifier before conducting the last operation phase to store the result (described below).

The last operation phase illustrated in the timing diagram of FIG. 5D is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 5D, at time equilibration is disabled (e.g., the equilibration signal 526 is deactivated) such that data lines D and D_ are floating. At time $t_2$, the Passd control signal 511 (and Passdb signal) is activated for an AND or OR operation.

Activating the Passd control signal 511 (and Passdb signal) (e.g., in association with an AND or OR operation) transfers the Comp_Computed output stored in the secondary latch of compute component 231 shown in FIG. 2A to the primary latch of sense amplifier 206. For instance, for an AND operation, if any of the memory cells sensed in the prior operation phases (e.g., the first operation phase illustrated in FIG. 5A and one or more iterations of the intermediate operation phase illustrated in FIG. 5B) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D will carry a voltage corresponding to logic "0" and data line D_ will carry a voltage corresponding to logic "1". At time $t_3$, the primary latch of sense amplifier 206 is then enabled (e.g., a positive control signal 290 (e.g., corresponding to ACT 290 shown in FIG. 2B) goes high and the negative control signal 528 (e.g., corresponding to RnIF 228 shown in FIG. 2B) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 5A and one or more iterations of the intermediate operation phase shown in FIG. 5C) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time $t_3$, the primary latch of sense amplifier 206 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 5D, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 5D show, at time $t_3$, the positive control signal 590 and the negative control signal 528 being deactivated (e.g., signal 590 goes high and signal 528 goes low) to disable the sense amplifier 206 shown in FIG. 2A. At time $t_4$ the Passd control signal 511 (and Passdb signal) that was activated at time $t_2$ is deactivated. Embodiments are not limited to this example. For instance, in a number of embodiments, the sense amplifier 206 shown in FIG. 2A may be enabled subsequent to time $t_4$ (e.g., after he Passd control signal 511 (and Passdb signal) are deactivated).

As shown in FIG. 5D, at time $t_5$, a selected row is enabled (e.g., by row activation signal 504 going high, which drives the capacitor of the selected cell to the voltage corresponding to the logic value stored in the Comp_Compulator. At time $t_6$ the selected row is disabled. At time $t_7$ the sense amplifier 206 shown in FIG. 2A is disabled (e.g., positive control signal 528 and negative control signal 590 are deactivated in FIG. 5D), and at time $t_8$ equilibration occurs (e.g., signal 526 is activated and the voltages on the complementary data lines 505-1 (D) and 505-2 (D_) are brought to the equilibration voltage, as shown in FIG. 5D).

Although the example of performing a last operation phase of an R-input was discussed above with respect to FIG. 5D for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

The functionality of the sensing circuitry 250 of FIG. 2A is described below and summarized in Table 1 below with respect to performing logical operations and initially storing a result in the sense amplifier 206. Initially storing the result of a particular logical operation in the primary latch of sense amplifier 206 can provide improved versatility as compared to previous approaches in which the result may initially reside in a secondary latch (e.g., Comp_Compulator) of a compute component 231, and then be subsequently transferred to the sense amplifier 206, for instance.

TABLE 1

| Operation | Comp_Compulator | Sense Amp |
| --- | --- | --- |
| AND | Unchanged | Result |
| OR | Unchanged | Result |
| NOT | Unchanged | Result |
| SHIFT | Unchanged | Shifted Data |

Initially storing the result of a particular operation in the sense amplifier 206 (e.g., without having to perform an additional operation to move the result from the compute component 231 (e.g., Comp_Compulator) to the sense amplifier 206) is advantageous because, for instance, the result can be written to a row (of the array of memory cells) or back into the Comp_Compulator without performing a precharge cycle (e.g., on the complementary data lines 205-1 (D) and/or 205-2 (D_)).

Figure 6A:
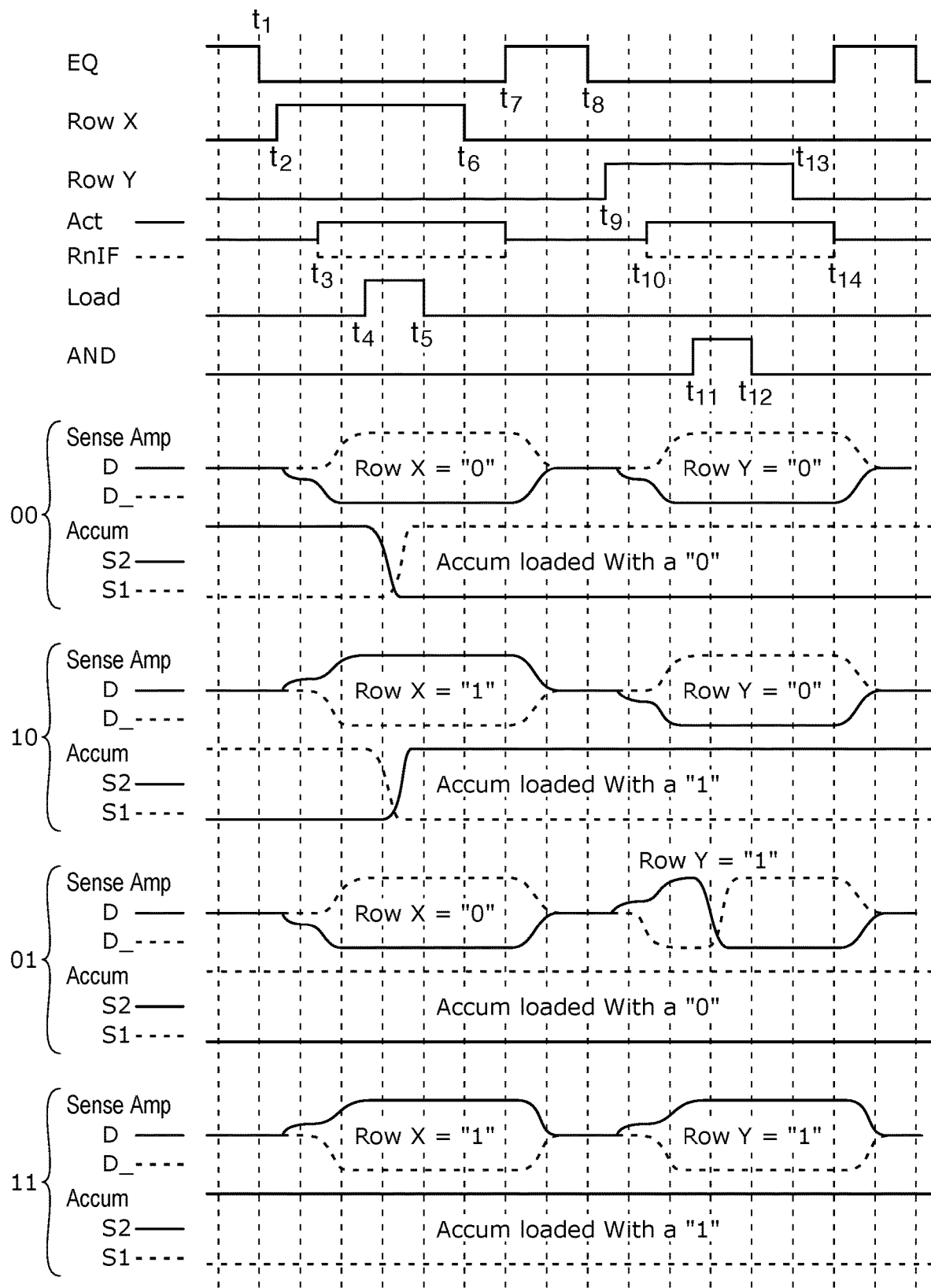
FIGS. 6A-6B illustrate timing diagrams associated with performing a number of logical operations using sensing circuitry in accordance with a number of embodiments of the present disclosure.

FIG. 6A illustrates a timing diagram associated with performing a number of logical operations using sensing circuitry in accordance with a number of embodiments of the present disclosure. FIG. 6A illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 6A illustrates a number of control signals associated with operating sensing circuitry (e.g., 250 in FIG. 2A) to perform the AND logical operation. "EQ" corresponds to an equilibrate signal applied to the sense amp 206, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206, "LOAD" corresponds to a load control signal (e.g., LOAD/PASSD and LOAD/PASSDb shown in FIG. 2A), and "AND" corresponds to the AND control signal shown in FIG. 2A. FIG. 6A also illustrates the waveform diagrams showing the signals (e.g., voltage signals) on the digit lines D and D corresponding to sense amp 206 and on the nodes S1 and S2 corresponding to the compute component 231 (e.g., Comp_Comp) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the Comp_Compulator can be summarized as follows:

```
Copy Row X into the Comp_Compulator:
    Deactivate EQ
    Open Row X
    Fire Sense Amps (after which Row X data
    resides in the sense amps)
    Activate LOAD (sense amplifier data (Row X)
    is transferred to nodes
    S1 and S2 of the Comp_Compulator and resides there dynamically)
    Deactivate LOAD
    Close Row X
    Precharge
```

In the pseudo code above, "Deactivate EQ" indicates that an equilibration signal (EQ signal shown in FIG. 6A) corresponding to the sense amplifier 206 is disabled at $t_1$ as shown in FIG. 6A (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 6A. When the voltage signal applied to ROW X reaches the threshold voltage (Vt) of the access transistor (e.g., 202-2) corresponding to the selected cell, the access transistor turns on and couples the data line (e.g., 205-2 (D_)) to the selected cell (e.g., to capacitor 203-2) which creates a differential voltage signal between the data lines.

After Row X is enabled, in the pseudo code above, "Fire Sense Amps" indicates that the sense amplifier 206 is enabled to set the primary latch and subsequently disabled. For example, as shown at $t_3$ in FIG. 6A, the ACT positive control signal (e.g., 290 shown in FIG. 2B) goes high and the RnIF negative control signal (e.g., 228 shown in FIG. 2B) goes low, which amplifies the differential signal between 205-1 (D) and D_ 205-2, resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). The sensed data value is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and Comp_Compulator signals illustrated in FIG. 6A (e.g., one for each combination of Row X and Row Y data values) shows the behavior of signals on data lines D and D_. The Row X data value is stored in the primary latch of the sense amp. It should be noted that FIG. 2A shows that the memory cell including storage element 202-2, corresponding to Row X, is coupled to the complementary data line D_, while the memory cell including storage element 202-1, corresponding to Row Y, is coupled to data line D. However, as can be seen in FIG. 2A, the charge stored in memory cell 202-2 (corresponding to Row X) corresponding to a "0" data value causes the voltage on data line D_ (to which memory cell 202-2 is coupled) to go high and the charge stored in memory cell 202-2 corresponding to a "1" data value causes the voltage on data line D_ to go low, which is opposite correspondence between data states and charge stored in memory cell 202-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 6A, causing load/pass transistors 218-1 and 218-2 to conduct. In this manner, activating the LOAD control signal enables the secondary latch in the Comp_Compulator of the compute component 231. The sensed data value stored in the sense amplifier 206 is transferred (e.g., copied) to the secondary latch. As shown for each of the four sets of possible sense amplifier and Comp_Compulator signals illustrated in FIG. 6A, the behavior at inputs of the secondary latch of the Comp_Compulator indicates the secondary latch is loaded with the Row X data value. As shown in FIG. 6A, the secondary latch of the Comp_Compulator may flip (e.g., see Comp_Compulator signals for Row X="0" and Row Y="0" and for Row X="1" and Row Y="0"), or not flip (e.g., see Comp_Compulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_) in FIG. 2A) in the pseudo code above, "Deactivate LOAD" indicates that the LOAD control signal goes back low as shown at is in FIG. 6A to cause the load/pass transistors 218-1 and 218-2 to stop conducting and thereby isolate the dynamic latch from the complementary data lines. However, the data value remains dynamically stored in secondary latch of the Comp_Compulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 6A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 6A by the EQ signal going high at $t_7$. As shown in each of the four sets of possible sense amplifier and Comp_Compulator signals illustrated in FIG. 6A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206 and the secondary latch of the compute component 231 shown in FIG. 2A) and the second data value (stored in a memory cell 202-1 coupled to Row Y 204-Y) includes performing particular steps which depend on the whether an AND or an OR is to be performed. Examples of pseudo code associated with "ANDing" and "ORing" the data value residing in the Comp_Compulator (e.g., the first data value stored in the memory cell 202-2 coupled to Row X 204-X) and the second data value (e.g., the data value stored in the memory cell 202-1 coupled to Row Y 204-Y) are summarized below. Example pseudo code associated with "ANDing" the data values can include:

```
Deactivate EQ
Open Row Y
Fire Sense Amps (after which Row Y data resides in the sense amps)
Close Row Y
    The result of the logic operation, in the next operation, will be placed
on the sense amp, which will overwrite any row that is active.
    Even when Row Y is closed, the sense amplifier still contains the
Row Y data value.
Activate AND
    This results in the sense amplifier being written to the value of the
function (e.g., Row X AND Row Y)
        If the Comp_Compulator contains a "0" (i.e., a voltage
corresponding to a "0" on node S2 and a voltage corresponding to a "1" on node
S1), the sense amplifier data is written to a "0"
        If the Comp_Compulator contains a "1" (i.e., a voltage
corresponding to a "1" on node S2 and a voltage corresponding to a "0" on node
S1), the sense amplifier data remains unchanged (Row Y data)
            This operation leaves the data in the Comp_Compulator unchanged.
Deactivate AND
Precharge
```

In the pseudo code above, "Deactivate EQ" indicates that an equilibration signal corresponding to the sense amplifier 206 is disabled (e.g., such that the complementary data lines 205-1 (D) and 205-2 (D_) are no longer shorted to $V_{DD}/2$), which is illustrated in FIG. 6A at $t_8$. After equilibration is disabled, a selected row (e.g., ROW Y) is enabled as indicated in the pseudo code above by "Open Row Y" and shown in FIG. 6A at $t_9$. When the voltage signal applied to ROW Y reaches the threshold voltage (Vt) of the access transistor (e.g., 202-1) corresponding to the selected cell, the access transistor turns on and couples the data line (e.g., D_ 205-1) to the selected cell (e.g., to capacitor 203-1) which creates a differential voltage signal between the data lines.

After Row Y is enabled, in the pseudo code above, "Fire Sense Amps" indicates that the sense amplifier 206 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). As shown at $t_{10}$ in FIG. 6A, the ACT positive control signal (e.g., 290 shown in FIG. 2B) goes high and the RnIF negative control signal (e.g., 228 shown in FIG. 2B) goes low to fire the sense amps. The sensed data value from memory cell 202-1 is stored in the primary latch of sense amplifier 206, as previously described. The secondary latch still corresponds to the data value from memory cell 202-2 since the dynamic latch is unchanged.

After the second data value sensed from the memory cell 202-1 coupled to Row Y is stored in the primary latch of sense amplifier 206, in the pseudo code above, "Close Row Y" indicates that the selected row (e.g., ROW Y) can be disabled if it is not desired to store the result of the AND logical operation back in the memory cell corresponding to Row Y. However, FIG. 6A shows that Row Y is left enabled such that the result of the logical operation can be stored back in the memory cell corresponding to Row Y. Isolating the memory cell corresponding to Row Y can be accomplished by the access transistor turning off to decouple the selected cell 202-1 from the data line 205-1 (D). After the selected Row Y is configured (e.g., to isolate the memory cell or not isolate the memory cell), "Activate AND" in the pseudo code above indicates that the AND control signal goes high as shown in FIG. 6A at $t_{11}$, causing pass transistor 207-1 to conduct. In this manner, activating the AND control signal causes the value of the function (e.g., Row X AND Row Y) to be written to the sense amp.

With the first data value (e.g., Row X) stored in the dynamic latch of the Comp_Compulator 231 and the second data value (e.g., Row Y) stored in the sense amplifier 206, if the dynamic latch of the compute component 231 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 209-1 to conduct thereby coupling the sense amplifier 206 to ground through transistor 209-1, pass transistor 207-1 and data line 205-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 206. This operation leaves the data value in the Comp_Compulator unchanged (e.g., from Row X).

If the secondary latch of the Comp_Compulator contains a "1" (e.g., from Row X), then the result of the AND operation depends on the data value stored in the sense amplifier 206 (e.g., from Row Y). The result of the AND operation should be a "1" if the data value stored in the sense amplifier 206 (e.g., from Row Y) is also a "1," but the result of the AND operation should be a "0" if the data value stored in the sense amplifier 206 (e.g., from Row Y) is also a "0." The sensing circuitry 250 is configured such that if the dynamic latch of the Comp_Compulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206 remains unchanged (e.g., Row Y data value so the AND operation result is a "1" if the Row Y data value is a "1" and the AND operation result is a "0" if the Row Y data value is a "0"). This operation leaves the data value in the Comp_Compulator unchanged (e.g., from Row X).

After the result of the AND operation is initially stored in the sense amplifier 206, "Deactivate AND" in the pseudo code above indicates that the AND control signal goes low as shown at $t_{12}$ in FIG. 6A, causing pass transistor 207-1 to stop conducting to isolate the sense amplifier 206 (and data line 205-1 (D)) from ground. If not previously done, Row Y can be closed (as shown at $t_{13}$ in FIG. 6A) and the sense amplifier can be disabled (as shown at $t_{14}$ in FIG. 6A by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 6A).

FIG. 6A shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S1 of the secondary latch of the compute component (e.g., 231 shown in FIG. 2A) for an AND logical operation involving each of the possible combination of operands (e.g., Row X/Row Y data values 00, 10, 01, and 11).

Although the timing diagrams illustrated in FIG. 6A and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 6B:
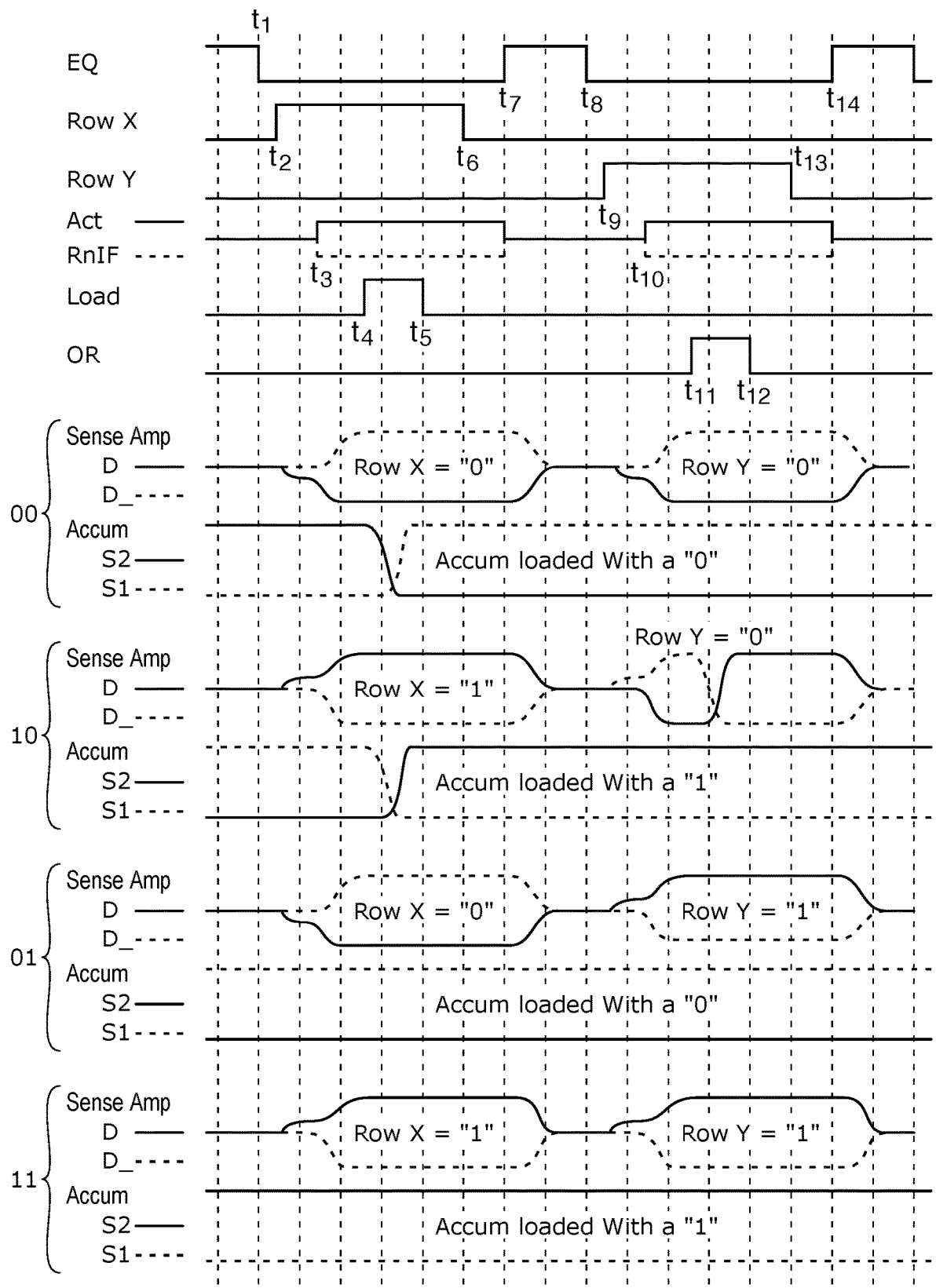

FIG. 6B illustrates a timing diagram associated with performing a number of logical operations using sensing circuitry in accordance with a number of embodiments of the present disclosure. FIG. 6B illustrates a timing diagram associated with initiating an OR logical operation after starting to load the second operand (e.g., Row Y data value) into the sense amplifier. FIG. 6B illustrates the sense amplifier and Comp_Compulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206 and the secondary latch of the compute component 231) and the second data value (stored in a memory cell 202-1 coupled to Row Y 204-Y). The operations to load the Row X data into the sense amplifier and Comp_Compulator that were previously described with respect to times $t_1$-$t_7$ shown in FIG. 6A are not repeated with respect to FIG. 6B. Example pseudo code associated with "ORing" the data values can include:

```
Deactivate EQ
Open Row Y
Fire Sense Amps (after which Row Y data resides in the sense amps)
Close Row Y
    When Row Y is closed, the sense amplifier still contains the Row Y
data value.
Activate OR
    This results in the sense amplifier being written to the value of the
function (e.g., Row X OR Row Y), which may overwrite the data value from Row
Y previously stored in the sense amplifier as follows:
        If the Comp_Compulator contains a "0" (i.e., a voltage
corresponding to a "0" on node S2 and a voltage corresponding to a "1" on node
S1), the sense amplifier data remains unchanged (Row Y data)
        If the Comp_Compulator contains a "1" (i.e., a voltage
corresponding to a "1" on node S2 and a voltage corresponding to a "0" on node
S1), the sense amplifier data is written to a "1"
            This operation leaves the data in the Comp_Compulator unchanged.
Deactivate OR
Precharge
```

The "Deactivate EQ" (shown at is in FIG. 6B), "Open Row Y" (shown at $t_9$ in FIG. 6B), "Fire Sense Amps" (shown at $t_{10}$ in FIG. 6B), and "Close Row Y" (shown at $t_{13}$ in FIG. 6B, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6B, which causes pass transistor 207-2 to conduct. In this manner, activating the OR control signal causes the value of the function (e.g., Row X OR Row Y) to be written to the sense amp.

With the first data value (e.g., Row X) stored in the secondary latch of the compute component 231 and the second data value (e.g., Row Y) stored in the sense amplifier 206, if the dynamic latch of the Comp_Compulator contains a "0" (i.e., a voltage corresponding to a "0" on node S2 and a voltage corresponding to a "1" on node S1), then the result of the OR operation depends on the data value stored in the sense amplifier 206 (e.g., from Row Y). The result of the OR operation should be a "1" if the data value stored in the sense amplifier 206 (e.g., from Row Y) is a "1," but the result of the OR operation should be a "0" if the data value stored in the sense amplifier 206 (e.g., from Row Y) is also a "0." The sensing circuitry 250 is configured such that if the dynamic latch of the Comp_Compulator contains a "0," with the voltage corresponding to a "0" on node S2, transistor 209-2 is off and does not conduct (and pass transistor 207-1 is also off since the AND control signal is not asserted) so the sense amplifier 206 is not coupled to ground (either side), and the data value previously stored in the sense amplifier 206 remains unchanged (e.g., Row Y data value such that the OR operation result is a "1" if the Row Y data value is a "1" and the OR operation result is a "0" if the Row Y data value is a "0").

If the dynamic latch of the Comp_Compulator contains a "1" (i.e., a voltage corresponding to a "1" on node S2 and a voltage corresponding to a "0" on node S1), transistor 209-2 does conduct (as does pass transistor 207-2 since the OR control signal is asserted), and the sense amplifier 206 input coupled to data line 205-2 (D_) is coupled to ground since the voltage corresponding to a "1" on node S2 causes transistor 209-2 to conduct along with pass transistor 207-2 (which also conducts since the OR control signal is asserted). In this manner, a "1" is initially stored in the sense amplifier 206 as a result of the OR operation when the secondary latch of the Comp_Compulator contains a "1" regardless of the data value previously stored in the sense amp. This operation leaves the data in the Comp_Compulator unchanged. FIG. 6B shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S2 of the secondary latch of the compute component 231 for an OR logical operation involving each of the possible combination of operands (e.g., Row X/Row Y data values 00, 10, 01, and 11).

After the result of the OR operation is initially stored in the sense amplifier 206, "Deactivate OR" in the pseudo code above indicates that the OR control signal goes low as shown at $t_{12}$ in FIG. 6B, causing pass transistor 207-2 to stop conducting to isolate the sense amplifier 206 (and data line D 205-2) from ground. If not previously done, Row Y can be closed (as shown at $t_{13}$ in FIG. 6B) and the sense amplifier can be disabled (as shown at $t_{14}$ in FIG. 4 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6B.

The sensing circuitry 250 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {—Row X AND Row Y} (where "—Row X" indicates an opposite of the Row X data value, e.g., NOT Row X) and can be changed from {Row X OR Row Y} to {—Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 214-1 to conduct and activating the ANDinv control signal causes transistor 214-2 to conduct. In each case, asserting the appropriate inverted control signal can flip the sense amplifier and cause the result initially stored in the sense amplifier 206 to be that of the AND operation using inverted Row X and true Row Y data values or that of the OR operation using the inverted Row X and true Row Y data values. A true or compliment version of one data value can be used in the Comp_Compulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the Comp_Compulator and using that data to invert the data value in the sense amplifier 206. As previously mentioned, activating the ORinv control signal causes transistor 214-1 to conduct and activating the ANDinv control signal causes transistor 214-2 to conduct. The ORinv and/or ANDinv control signals are used in implementing the NOT function, as described further below:

---

Copy Row X into the Comp_Compulator
    Deactivate EQ
    Open Row X
    Fire Sense Amps (after which Row X data resides in the sense amps)
    Activate LOAD (sense amplifier data (Row X) is transferred to nodes S1 and S2 of the Comp_Compulator and resides there dynamically
    Deactivate LOAD
    Activate ANDinv and ORinv (which puts the compliment data value on the data lines)
    This results in the data value in the sense amplifier being inverted (e.g., the sense amplifier latch is flipped)
        This operation leaves the data in the Comp_Compulator unchanged
    Deactivate ANDinv and ORinv
    Close Row X
    Precharge

---

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Comp_Compulator" initial operation phase described above prior to pseudo code for the AND operation and OR operation. However, rather than closing the Row X and Precharging after the Row X data is loaded into the sense amplifier 206 and copied into the dynamic latch, a compliment version of the data value in the dynamic latch of the Comp_Compulator can be placed on the data line and thus transferred to the sense amplifier 206 by enabling (e.g., causing transistor to conduct) and disabling the invert transistors (e.g., ANDinv and ORinv). This results in the sense amplifier 206 being flipped from the true data value that was previously stored in the sense amplifier to a compliment data value (e.g., inverted data value) stored in the sense amp. For example, a true or compliment version of the data value in the Comp_Compulator can be transferred to the sense amplifier by activating and deactivating ANDinv and ORinv. This operation leaves the data in the Comp_Compulator unchanged.

Because the sensing circuitry 250 shown in FIG. 2A initially stores the result of the AND, OR, and NOT logical operations in the sense amplifier 206 (e.g., on the sense amplifier nodes), these logical operation results can be communicated easily and quickly to any enabled row, any row activated after the logical operation is complete, and/or into the secondary latch of the compute component 231. The sense amplifier 206 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206 fires.

When performing logical operations in this manner, the sense amplifier 206 can be pre-seeded with a data value from the dynamic latch of the Comp_Compulator to reduce overall current utilized because the sense amps 206 are not at full rail voltages (e.g., supply voltage or ground/reference voltage) when Comp_Compulator function is copied to the sense amplifier 206. An operation sequence with a pre-seeded sense amplifier 206 either forces one of the data lines to the reference voltage (leaving the complementary data line at $V_{DD}/2$, or leaves the complementary data lines unchanged. The sense amplifier 206 pulls the respective data lines to full rails when the sense amplifier 206 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 223 can be used for shifting data values stored in memory cells coupled to a particular pair of complementary data lines to the sensing circuitry 250 (e.g., sense amplifier 206) corresponding to a different pair of complementary data lines (e.g., such as a sense amplifier 206 corresponding to a left or right adjacent pair of complementary data lines. As used herein, a sense amplifier 206 corresponds to the pair of complementary data lines to which the sense amplifier is coupled when isolation transistors 221-1 and 221-2 are conducting. The SHIFT operations (right or left) do not pre-copy the Row X data value into the Comp_Compulator. Operations to shift right Row X can be summarized as follows:

Deactivate Norm and Activate Shift
Deactivate EQ
Open Row X
Fire Sense Amps (after which shifted Row X data resides in the sense amps)
Activate Norm and Deactivate Shift
Close Row X
Precharge In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Comp_Compulator" initial operation phase described above prior to pseudo code for the AND operation and OR operation. After these operations, the Row X data value for the memory cell coupled to the left adjacent pair of complementary data lines is shifted right and stored in the sense amplifier 206.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

Activate Norm and Deactivate Shift
Deactivate EQ
Open Row X
Fire Sense Amps (after which Row X data resides in the sense amps)
Deactivate Norm and Activate Shift
    Sense amplifier data (shifted left Row X) is transferred to Row X
Close Row X
Precharge In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Comp_Compulator" initial operation phase described above prior to pseudo code for the AND operation and OR operation. After these operations, the Row X data value for the memory cell coupled to the pair of complementary data lines corresponding to the sense circuitry 250 is stored in the sense amplifier 206.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDS or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred there between. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   determining a vector population count of a number of elements of a vector stored in a memory array, wherein the number of elements of the vector are stored in a portion of a row in the memory array by:
      performing a number of comparison iterations in a compute component coupled to the memory array, wherein performing the number of comparison iterations comprises:
         determining a reduction vector for each of the number of comparison iterations, wherein determining the reduction vector includes determining a reduction vector width for each of the number of comparison iterations and wherein each of the number of comparison iterations compares a number of bits that correspond to the reduction vector width;
         determining a pattern mask for each of the number of comparison iterations; and
         performing a half add operation of a first portion and a second portion of the pattern mask for each of the number of comparison iterations.

2. The method of claim 1, comprising determining a quantity of comparison iterations to perform by calculating log 2 of a number of bits in each of the number of elements.

3. The method of claim 1, comprising determining an elemental mask for the vector, wherein the elemental mask represents a most significant bit of each of the number of elements.

4. The method of claim 1, wherein performing the number of comparison iterations includes comparing 2n bits during each respective comparison iteration.

5. The method of claim 1, wherein performing the number of comparison iterations includes performing a loop that includes shifting a carry of the half add operation to a left one place, and checking for carry values using a BlockOR operation, and performing a second half add operation with the carry values and a sum of the half add operation.

6. An apparatus comprising:
   a group of memory cells coupled to a first access line of a memory array and configured to store a number of elements on a portion of the first access line; and
   a compute component coupled to the memory array;
   wherein the apparatus is configured to:
      perform a number of comparison iterations, wherein each of the number of comparison iterations includes:
         determining a reduction vector for each of the number of comparison iterations, wherein determining the reduction vector includes determining a reduction vector width for each of the number of comparison iterations and wherein each of the number of comparison iterations compares a number of bits that correspond to the reduction vector width;
determining a pattern mask for each of the number of comparison iterations; and
performing a half add operation of a first portion and a second portion of the pattern mask for each of the number of comparison iterations; and
output a vector population count that indicates how many bits of each of the number of elements have a particular data value in response to performing the number of comparison iterations.

7. The apparatus of claim 6, wherein the apparatus is configured to determine the number of comparison iterations to perform by calculating log 2 of a number of bits in the number of elements.

8. The apparatus of claim 6, wherein the apparatus is configured to calculate an output for each of the number of comparison iterations that is used by a subsequent comparison iteration to determine the vector population count.

9. The apparatus of claim 6, wherein the apparatus is configured to perform at least one of an AND operation, an OR operation, and a SHIFT operation using sensing circuitry to determine the vector population count.

10. An apparatus, comprising:
a group of memory cells coupled to a first access line of a memory array and configured to store a vector comprising a number of elements on a portion of the first access line; and
a compute component coupled to the memory array;
wherein the apparatus is configured to:
perform at least one of an AND operation, an OR operation, and a SHIFT operation using the compute component to determine a vector population count of the number of elements by:
determining a reduction vector for each of a number of comparison iterations, wherein determining the reduction vector includes determining a reduction vector width for each of the number of comparison iterations and wherein each of the number of comparison iterations compares a number of bits that correspond to the reduction vector width;
determining a pattern mask for each of the number of comparison iterations, wherein each of the pattern masks include a first portion of the pattern mask and a second portion of the pattern mask; and
performing a half add operation on the first portion of the pattern mask and the second portion of the pattern mask for each of the number of comparison iterations.

11. The apparatus of claim 10, wherein the apparatus is configured to output a vector population count for each of the number of elements.

12. The apparatus of claim 10, wherein the apparatus is configured to determine a most significant bit of each of the number of elements.

13. The apparatus of claim 10, wherein the apparatus is configured to store elements representing a most significant bit of each of the number of elements as an elemental mask.

14. The apparatus of claim 10, wherein the apparatus is configured to determine the number of comparison iterations to perform by calculating log 2 of a number of bits in the number of elements.

15. The apparatus of claim 10, wherein the vector includes 256 bits.

16. The apparatus of claim 15, wherein the vector includes eight 32 bit elements.

17. The apparatus of claim 15, wherein the vector includes one 256 bit element.

18. The apparatus of claim 15, wherein the vector includes four 64 bit elements.

* * * * *